US010930672B2

(12) United States Patent
Cho et al.

(10) Patent No.: US 10,930,672 B2
(45) Date of Patent: Feb. 23, 2021

(54) THREE-DIMENSIONAL SEMICONDUCTOR MEMORY DEVICES

(71) Applicant: SAMSUNG ELECTRONICS CO., LTD., Suwon-si (KR)

(72) Inventors: Siyeon Cho, Hwaseong-si (KR); Hyeri Shin, Seoul (KR); Sung-Bok Lee, Yongin-si (KR); Yusik Choi, Suwon-si (KR); Sungyung Hwang, Hwaseong-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 0 days.

(21) Appl. No.: 16/524,439

(22) Filed: Jul. 29, 2019

(65) Prior Publication Data

US 2020/0194455 A1 Jun. 18, 2020

(30) Foreign Application Priority Data

Dec. 14, 2018 (KR) ........................ 10-2018-0161637

(51) Int. Cl.
*H01L 27/11582* (2017.01)
*H01L 27/11524* (2017.01)
(Continued)

(52) U.S. Cl.
CPC .... *H01L 27/11582* (2013.01); *H01L 23/5283* (2013.01); *H01L 23/535* (2013.01);
(Continued)

(58) Field of Classification Search
CPC ......... H01L 27/11582; H01L 27/11524; H01L 27/11556; H01L 27/1157; H01L 27/2454; H01L 23/5283; H01L 23/535
See application file for complete search history.

(56) References Cited

U.S. PATENT DOCUMENTS 9,030,869 B2 5/2015 Yun et al.
9,183,893 B2 11/2015 Kanamori et al.
(Continued)

FOREIGN PATENT DOCUMENTS

EP 2731107 9/2016

*Primary Examiner* — Marc Anthony Armand
(74) *Attorney, Agent, or Firm* — F. Chau & Associates, LLC

(57) ABSTRACT

A three-dimensional (3D) semiconductor memory device includes a substrate including a cell array region, a connection region, and a block selection region between the cell array and connection regions, a stack structure including horizontal layers vertically stacked on the substrate, each of the horizontal layers including electrode portions extending in a first direction on the cell array and block selection regions and a connecting portion disposed on the connection region to connect the electrode portions in a second direction perpendicular to the first direction, and block selection gate electrodes intersecting sidewalls of the electrode portions of the horizontal layers on the block selection region. Each of the electrode portions includes a first semiconductor region having a first conductivity type on the cell array region and includes a channel dopant region having a second conductivity type different from the first conductivity type on the block selection region.

20 Claims, 18 Drawing Sheets

BL VGI VGE BSL 180 CL 170 160 CPLG 150 ILD HL ILD ST HL ILD HL 11 10 VS A 50 I CAR BSR CNR I'

(51) Int. Cl.

| | |
|---|---|
| ***H01L 27/11556*** | (2017.01) |
| ***H01L 27/1157*** | (2017.01) |
| ***H01L 23/528*** | (2006.01) |
| ***H01L 27/24*** | (2006.01) |
| ***H01L 27/22*** | (2006.01) |
| ***H01L 23/535*** | (2006.01) |

(52) U.S. Cl.

CPC .... *H01L 27/1157* (2013.01); *H01L 27/11524* (2013.01); *H01L 27/11556* (2013.01); *H01L 27/228* (2013.01); *H01L 27/249* (2013.01); *H01L 27/2454* (2013.01)

(56) References Cited

U.S. PATENT DOCUMENTS

| | | | | |
|---|---|---|---|---|
| 9,224,429 | B2 | 12/2015 | Park et al. | |
| 9,330,764 | B2 | 5/2016 | Lin et al. | |
| 9,343,507 | B2 | 5/2016 | Takaki | |
| 9,583,539 | B2 | 2/2017 | Takaki | |
| 9,666,239 | B2 | 5/2017 | Naito et al. | |
| 10,008,510 | B2 | 6/2018 | Sonehara et al. | |
| 2010/0133598 | A1* | 6/2010 | Chae | H01L 27/11578 257/314 |
| 2010/0133599 | A1* | 6/2010 | Chae | H01L 27/11565 257/315 |
| 2018/0175048 | A1 | 6/2018 | Yasuda et al. | |

* cited by examiner 180
170
160
BSL VGI
ESS
CSP
SS
VGE BSL
BSL
VGI
ILD
HL(CHR)
11
50
10
ST
BSR
III
III'

180
170
160
150
CPLG CL
CPLG CL
CPLG CL
CPLG CL
ILD
HL
ILD
HL
ILD
HL
11
10
ST
CNR
IV
IV'

HL
CPLG
HL
CPLG
HL
CPLG
HL
CPLG
ST
VGE
CHR
VS
CSP
BL
V'
V
VT
CNR
BSR
CAR
110(ESS)
BLK
110(ESS)
BLK
110(ESS)
BLK
110(ESS)
BLK
110(ESS)
D1
D2
D3

180
170
160
150
CL
CPLG
CHR
BPLG
BL
VS
V'
CNR
BSR
CAR
V
ILD
HL
ILD
HL
ILD
HL
11
10
ST

THREE-DIMENSIONAL SEMICONDUCTOR MEMORY DEVICES

CROSS-REFERENCE TO RELATED APPLICATION

This U.S. non-provisional patent application claims priority under 35 U.S.C. § 119 to Korean Patent Application No. 10-2018-0161637, filed on Dec. 14, 2018, in the Korean Intellectual Property Office, the disclosure of which is hereby incorporated by reference in its entirety.

BACKGROUND

Embodiments of the inventive concepts relate to three-dimensional (3D) semiconductor memory devices and, more particularly, to 3D semiconductor memory devices with improved reliability and integration density.

Semiconductor devices have been highly optimized to provide excellent performance and low manufacture costs. For example, a high integration density may enable reduced manufacturing costs. The integration density of two-dimensional (2D) or planar semiconductor devices is primarily determined by the area each unit memory cell occupies. Therefore, the integration density of the 2D or planar semiconductor devices is improved primarily though techniques for forming fine patterns.

However, extremely high-priced apparatuses are often needed to form fine patterns. So while the integration density of 2D semiconductor devices continues to increase, it is still limited by high costs. Thus, three-dimensional (3D) semiconductor memory devices have been developed to overcome the above limitations. 3D semiconductor memory devices may include memory cells three-dimensionally arranged.

SUMMARY

Embodiments of the inventive concepts may provide three-dimensional (3D) semiconductor memory devices capable of improving reliability and integration density.

In an aspect, a 3D semiconductor memory device may include a substrate including a cell array region, a connection region, and a block selection region between the cell array region and the connection region, a stack structure including horizontal layers vertically stacked on the substrate, each of the horizontal layers including a plurality of electrode portions extending in a first direction on the cell array region and the block selection region and a connecting portion disposed on the connection region to connect the electrode portions in a second direction perpendicular to the first direction, and block selection gate electrodes intersecting sidewalls of the electrode portions of the horizontal layers on the block selection region. Each of the electrode portions may include a first semiconductor region having a first conductivity type on the cell array region and may include a channel dopant region having a second conductivity type different from the first conductivity type on the block selection region.

In an aspect, a 3D semiconductor memory device may include a substrate including a cell array region, a connection region, and a block selection region between the cell array region and the connection region, a stack structure including semiconductor layers of a first conductivity type and interlayer insulating layers, which are vertically alternately stacked on the substrate, vertical structures intersecting inner sidewalls of the stack structure on the cell array region, and a block selection gate electrode intersecting a sidewall of the stack structure on the block selection region. Each of the semiconductor layers may include a channel dopant region which is adjacent to the block selection gate electrode on the block selection region and has a second conductivity type different from the first conductivity type.

In another aspect, A three-dimensional (3D) semiconductor memory device may include a substrate; and a stack structure including a plurality of horizontal layers stacked on the substrate, each of the horizontal layers including a plurality of electrode portions at least partially separated in a first horizontal direction, wherein each of the plurality of electrode portions includes a first conductivity type and a second conductivity type different from the first conductivity type; a connecting portion connecting the electrode portions in a second horizontal direction perpendicular to the first horizontal direction; a plurality of block selection gate electrodes, wherein each of the block selection gate electrodes selectively connects an electrode portion to the connecting portion; and a pad portion protruding from the connecting portion in the first horizontal direction, wherein the pad portions of the horizontal layers are arranged in a staircase structure extending in the second horizontal direction.

BRIEF DESCRIPTION OF THE DRAWINGS

The inventive concepts will become more apparent in view of the attached drawings and accompanying detailed description.

DETAILED DESCRIPTION OF THE EMBODIMENTS

Embodiments of the inventive concepts will be described hereinafter in detail with reference to the accompanying drawings. Aspects of the present disclosure relate to 3D vertical NAND (VNAND) flash memory technology. Other embodiments of the disclosure relate to a 3D variable resistance memory. NAND flash memory is a type of nonvolatile storage technology that does not require power to retain data. Two-dimensional (2D) planar NAND technology has intrinsic limitations that inhibit capacity expansion without compromising performance and reliability.

To address the scalability problems of 2D NAND, 3D memory technology may improve cell density by stacking memory cells vertically in a three-dimensional structure. Using a single die package (SDP) technique may reduce a chip size to a certain extent. However, when memory cells are vertically stacked, it is difficult to prevent the connection regions (i.e., the regions connecting the vertical layers to peripheral circuits) from increasing in size. That is, as the number of stacked layers in a stack structure increases, the area of the connection (or extension) region tends to increase as well, which may increase the chip size.

Therefore, aspects of the present disclosure describe a 3D semiconductor memory device in which a cell stack includes a stair structure along one side that provides an electrical connection between the horizontal layers and peripheral circuits. The stair structure allows the electrical connections to be confined to a relatively small horizontal area, enabling the peripheral circuits to be located closer to the stack structure and thereby decreasing the overall size of the chip.

Additionally, the horizontal layers of the memory blocks (i.e., the stacked layers) may share a single cell contact plug. Block selection transistors for controlling potentials of the stacked layers may be disposed within the block selection region between the cell array region and the connection region, so that individual layers may be selectively connected to the cell contact plug by.

Furthermore, block selection gate electrodes may intersect the sidewalls of the electrode portions. Each of the electrode portions may include a first region having a first conductivity type and a channel dopant region having a second, different conductivity type. The described embodiments may enable increased cell density of a 3D memory device, which may result in a reduced chip size, lower manufacturing costs, and improved durability.

Figure 1:
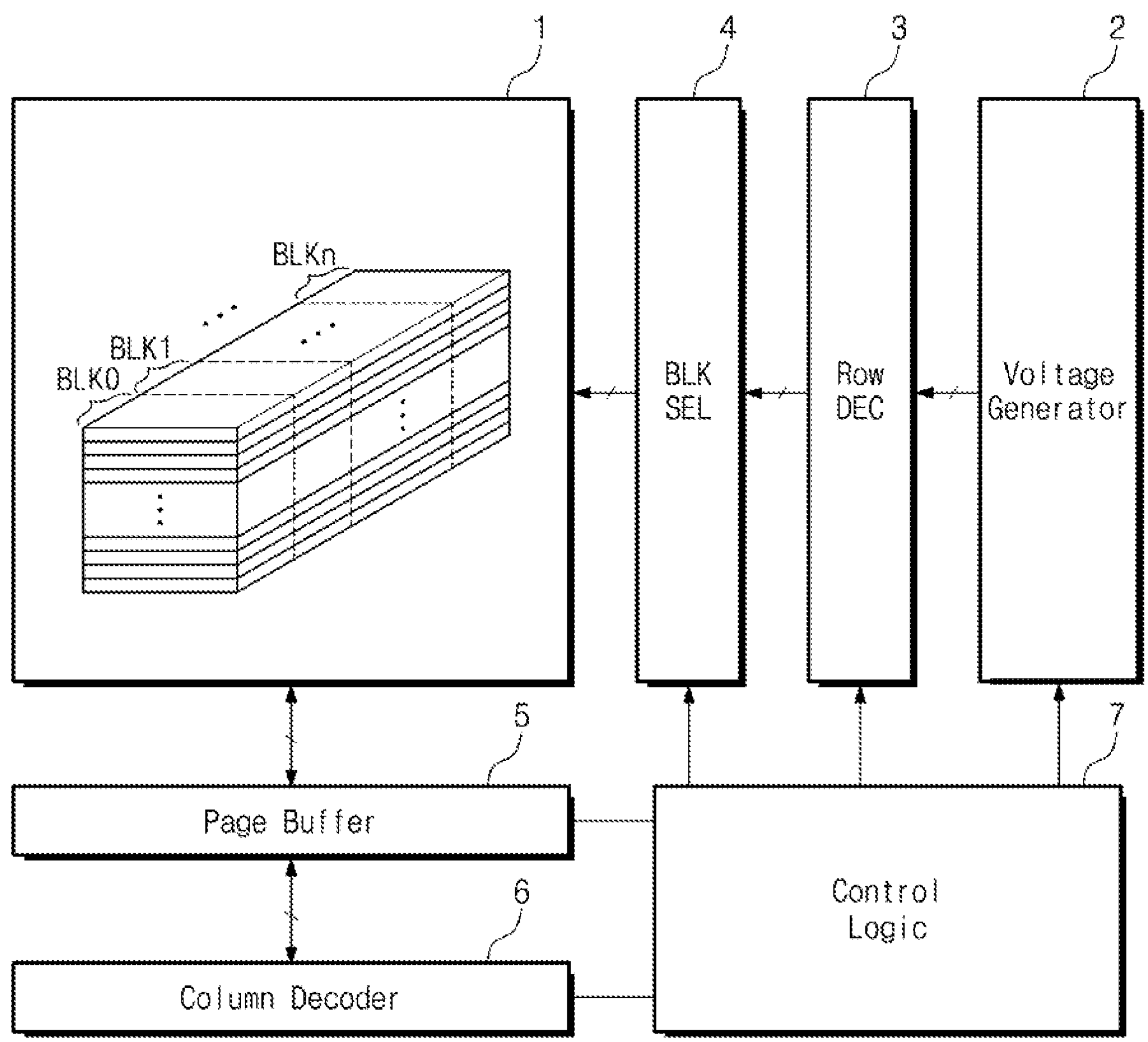
FIG. 1 is a block diagram illustrating a three-dimensional (3D) semiconductor memory device according to some embodiments of the inventive concepts.

FIG. 1 is a block diagram illustrating a 3D semiconductor memory device according to some embodiments of the inventive concepts.

Referring to FIG. 1, a 3D semiconductor memory device may include a memory cell array 1 and peripheral circuits for controlling the memory cell array 1. The peripheral circuits may include a voltage generator 2, a row decoder 3, a block selection circuit 4, a page buffer 5, a column decoder 6, and a control logic circuit 7.

The memory cell array 1 may include a plurality of memory blocks BLK0 to BLKn. Each of the memory blocks BLK0 to BLKn may include three-dimensionally arranged memory cells. For example, each of the memory blocks BLK0 to BLKn may include structures which are disposed on a plane defined by first and second directions intersecting each other and are stacked in a third direction perpendicular to the first and second directions. Data may be read from or written into at least one of the memory blocks BLK0 to BLKn, which is selected in response to a corresponding block selection signal.

In some embodiments, the 3D semiconductor memory device may be a vertical NAND flash memory device. In the case of a vertical NAND flash memory device, each of the memory blocks BLK0 to BLKn may include a plurality of cell strings formed in a NAND type. The cell strings may be two-dimensionally arranged in the first and second directions intersecting each other and may extend in the third direction perpendicular to the first and second directions. Each of the cell strings may include string selection transistors, memory cell transistors and a ground selection transistor, which are connected in series to each other. In addition, each of the memory cell transistors may include a data storage element.

In certain embodiments, the 3D semiconductor memory device may be a 3D variable resistance memory device. In the case of a 3D variable resistance memory device, the memory blocks BLK0 to BLKn may include memory cells respectively disposed at intersection points of word lines and bit lines. Each of the memory cells may include a resistive memory element. The resistive memory element may include at least one of a perovskite compound, a transition metal oxide, a phase-change material, a magnetic material, a ferromagnetic material, or an antiferromagnetic material.

The row decoder 3 may decode an address signal inputted from the outside to select one among word lines of a selected memory block.

The block selection circuit 4 may connect a selected one of the memory blocks BLK0 to BLKn to the row decoder 3 in response to a block selection signal. The block selection circuit 4 may include a plurality of block selection transistors connected to ends of the word lines of each of the memory blocks.

The page buffer 5 may be connected to the memory cell array 1 through bit lines to read data stored in the memory cells.

The column decoder 6 may decode an inputted address signal to select one among the bit lines. The column decoder 6 may provide a data transmission path between the page buffer 5 and an external device (e.g., a memory controller).

The voltage generator 2 may be controlled by the control logic circuit 7 to generate voltages (e.g., a program voltage, a read voltage, and an erase voltage) necessary for internal operations of the memory cell array 1.

Figure 2:
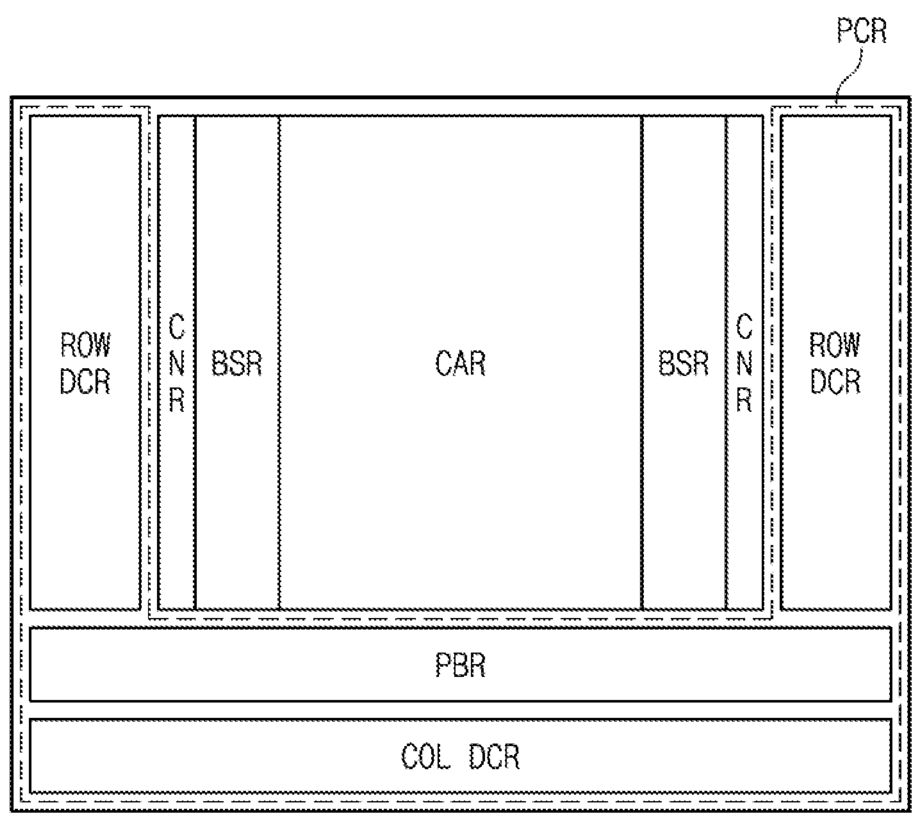
FIG. 2 is a schematic view illustrating arrangement of components of a 3D semiconductor memory device according to some embodiments of the inventive concepts.

FIG. 2 is a schematic view illustrating arrangement of components of a 3D semiconductor memory device according to some embodiments of the inventive concepts.

Referring to FIG. 2, a 3D semiconductor memory device may include a cell array region CAR and a peripheral circuit region PCR. The peripheral circuit region PCR may include row decoder regions ROW DCR, a page buffer region PBR, a column decoder region COL DCR, and a control circuit region (not shown). In some embodiments, a connection region CNR may be disposed between the cell array region CAR and each of the row decoder regions ROW DCR, and a block selection region BSR may be disposed between the cell array region CAR and the connection region CNR.

A memory cell array including a plurality of memory cells may be disposed in the cell array region CAR. The memory cell array may include three-dimensionally arranged memory cells, word lines, and bit lines. The word lines and the bit lines may be electrically connected to the memory cells.

An interconnection structure (e.g., contact plugs and conductive lines) for electrically connecting the memory cell array and the row decoder may be disposed in the connection region CNR. In example embodiments, the connection region CNR may include pads associated with each layer of the stacked structure, where the pads are arranged in a staircase pattern. This may enable each of the layers to be connected to the row decoder in a manner that takes up a relatively small area. This may enable a more efficient arrangement of the memory cell array.

Block selection transistors for selecting one of memory blocks may be disposed in the block selection region BSR. Gate voltages applied through the interconnection structure may be provided to word lines of a selected memory block by the block selection transistors. The block selection transistors may enable each of a plurality of electrode portions in the cell array region CAR to be selectively connected to a common contact plug.

The row decoder for selecting the word lines of the memory cell array may be disposed in the row decoder region ROW DCR. The row decoder may select one among the word lines of the memory cell array in response to an address signal.

A page buffer for sensing data stored in the memory cells may be disposed in the page buffer region PBR. According to an operation mode, the page buffer may temporarily store data to be stored in the memory cells or may sense data stored in the memory cells.

A column decoder connected to the bit lines of the memory cell array may be disposed in the column decoder region COL DCR. The column decoder may provide a data transmission path between the page buffer and an external device (e.g., a memory controller).

Figure 3:
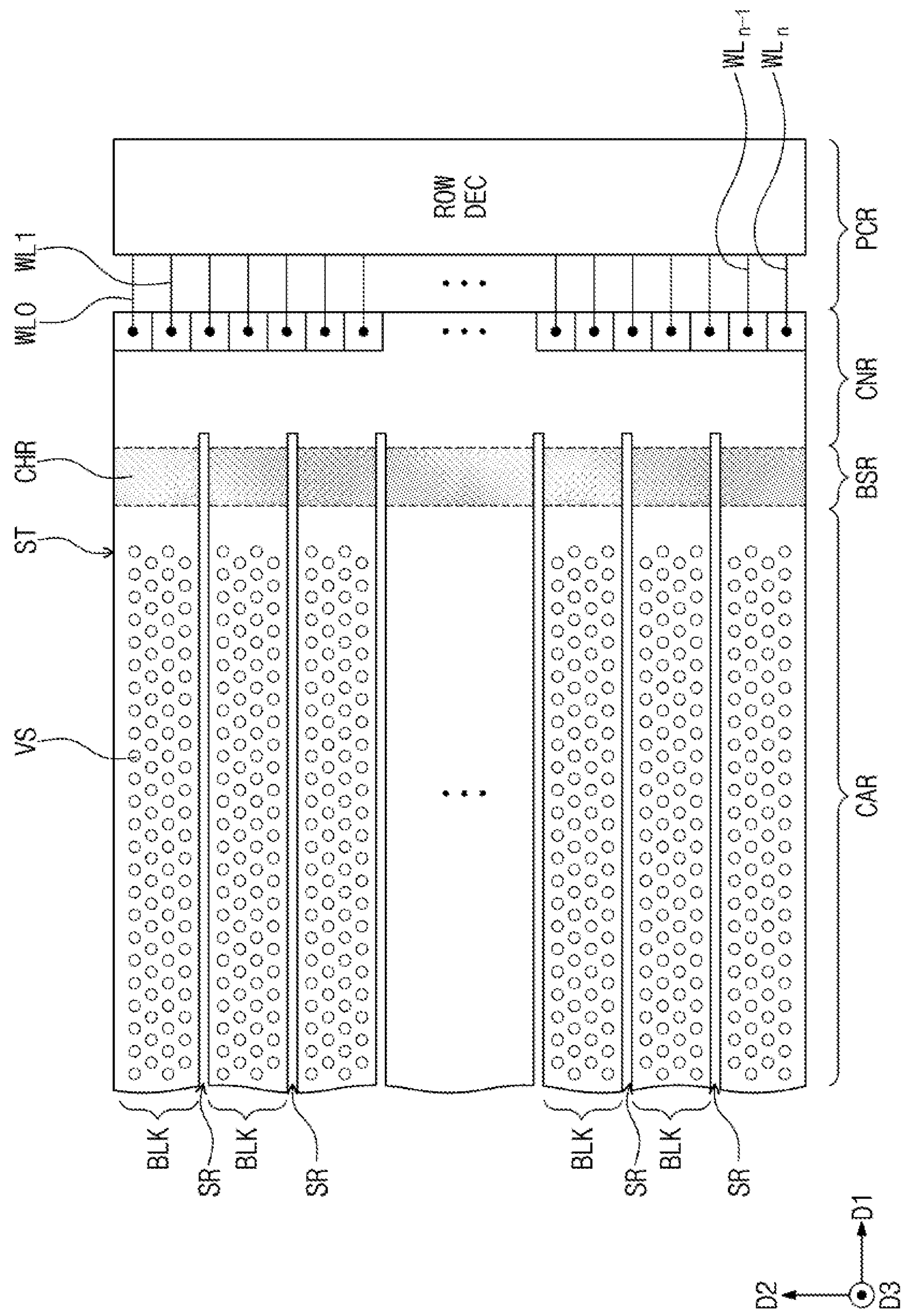
FIG. 3 is a schematic plan view illustrating a 3D semiconductor memory device according to some embodiments of the inventive concepts.

FIG. 3 is a schematic plan view illustrating a 3D semiconductor memory device according to some embodiments of the inventive concepts.

Referring to FIG. 3, a 3D semiconductor memory device may include a plurality of memory blocks BLK arranged in a second direction D2 intersecting a first direction D1, as described with reference to FIGS. 1 and 2. Each of the memory blocks BLK may include a memory cell array having a three-dimensional structure or a vertical structure.

The 3D semiconductor memory device may include a cell array region CAR, a block selection region BSR, a connection region CNR, and a peripheral circuit region PCR, which are arranged in the first direction D1. The block selection region BSR may be disposed between the cell array region CAR and the connection region CNR. The connection region CNR may be disposed between the block selection region BSR and the peripheral circuit region PCR.

In some embodiments, one stack structure ST may include a plurality of the memory blocks BLK. For example, the one stack structure ST may extend from the cell array region CAR to the connection region CNR in the first direction D1. The stack structure ST may include a plurality of horizontal layers HL (see FIG. 4) stacked in a third direction D3 perpendicular to the first and second directions D and D2.

The stack structure ST may include a plurality of electrode portions EP (see FIG. 10) spaced apart from each other by electrode separation regions SR extending in the first direction D1 in the cell array region CAR. In some embodiments, each of the horizontal layers HL of the stack structure ST may include a channel dopant region CHR in the block selection region BSR.

A plurality of vertical structures VS may be provided in the cell array region CAR. The vertical structures VS may penetrate the electrode portions EP of the stack structure ST in the third direction D3.

The stack structure ST may have a stair structure formed along the second direction D2 in the connection region CNR. Contact plugs and interconnection lines may be connected to the stair structure of the stack structure ST. The contact plugs and the interconnection lines may connect the stack structure ST to the row decoder.

The channel dopant region CHR in the block selection region BSR may enable each memory block BLK to be selectively connected to the connection region CNR, which may enable each block in a layer to share a common contact plug. As a result, the size of the connection region CNR may remain relatively small compared to the number of connected memory blocks.

Figure 4:
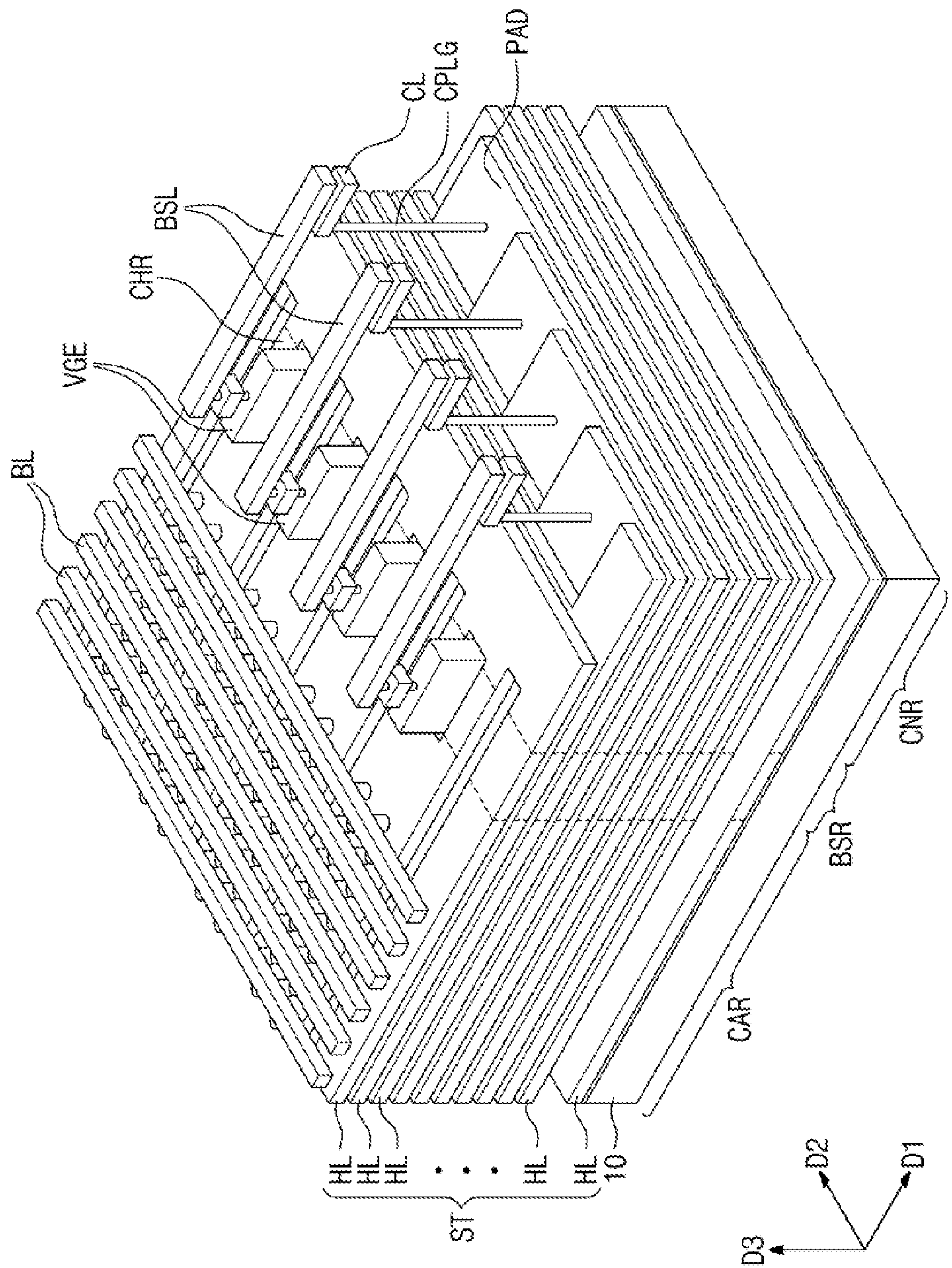
FIG. 4 is a perspective view illustrating a 3D semiconductor memory device according to some embodiments of the inventive concepts.
Figure 5:
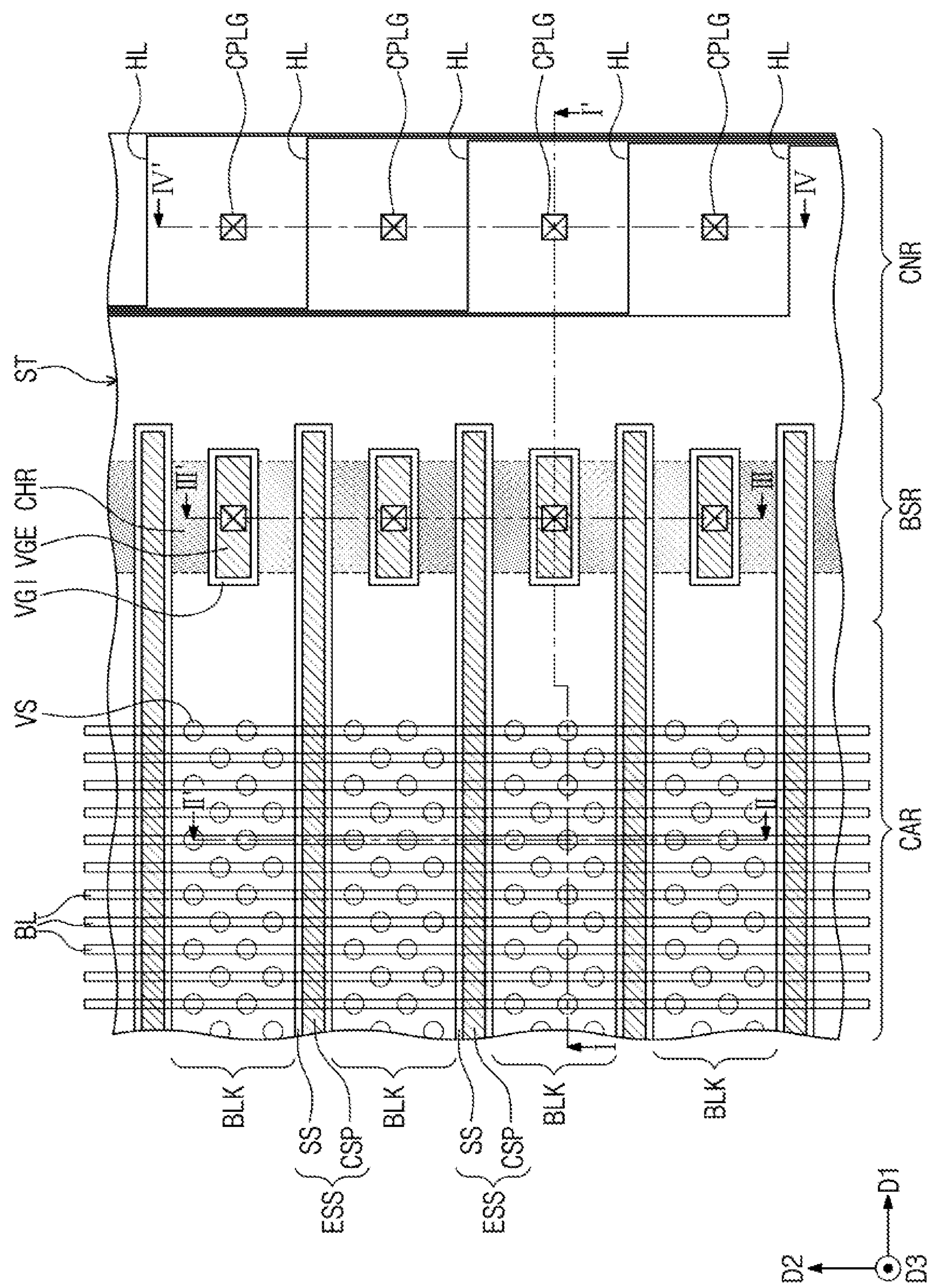
FIG. 5 is a plan view illustrating a 3D semiconductor memory device according to some embodiments of the inventive concepts.
Figure 6:
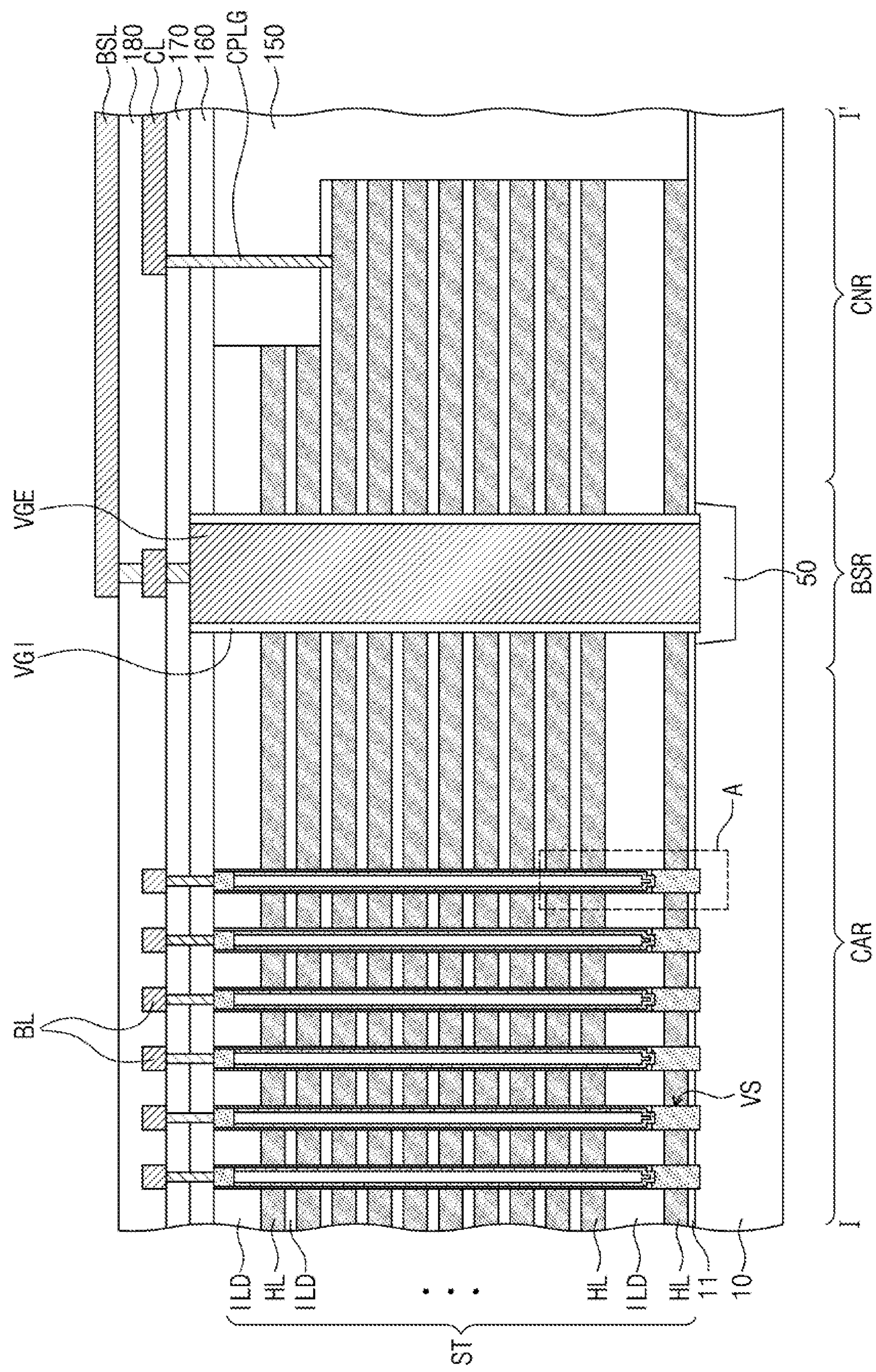
FIGS. 6 to 9 are cross-sectional views taken along lines I-I', II-II', III-III' and IV-IV' of FIG. 5, respectively, to illustrate a 3D semiconductor memory device according to some embodiments of the inventive concepts.
Figure 7:
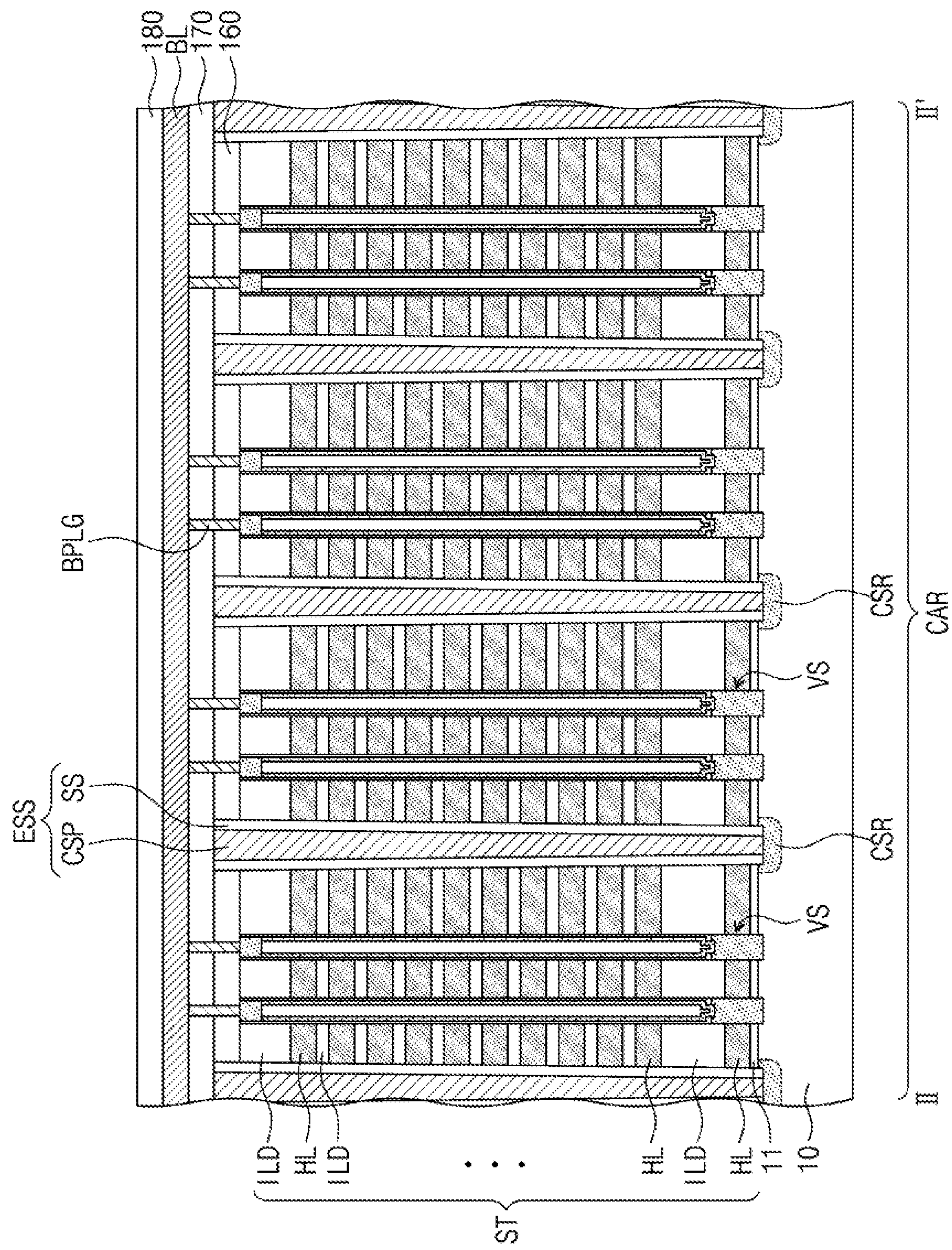
Figure 10:
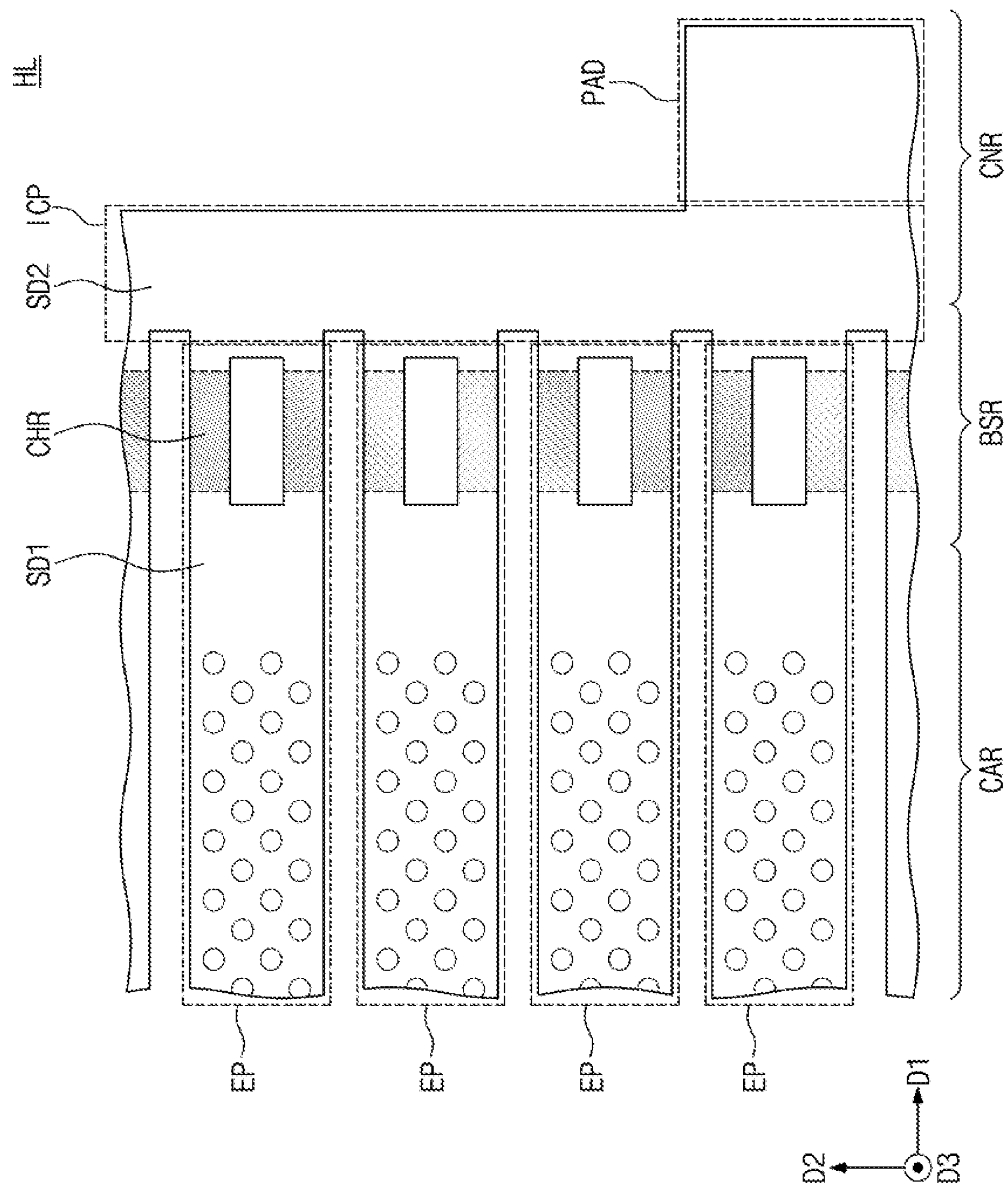
FIG. 10 is a plan view illustrating a horizontal layer according to some embodiments of the inventive concepts.
Figure 11A:
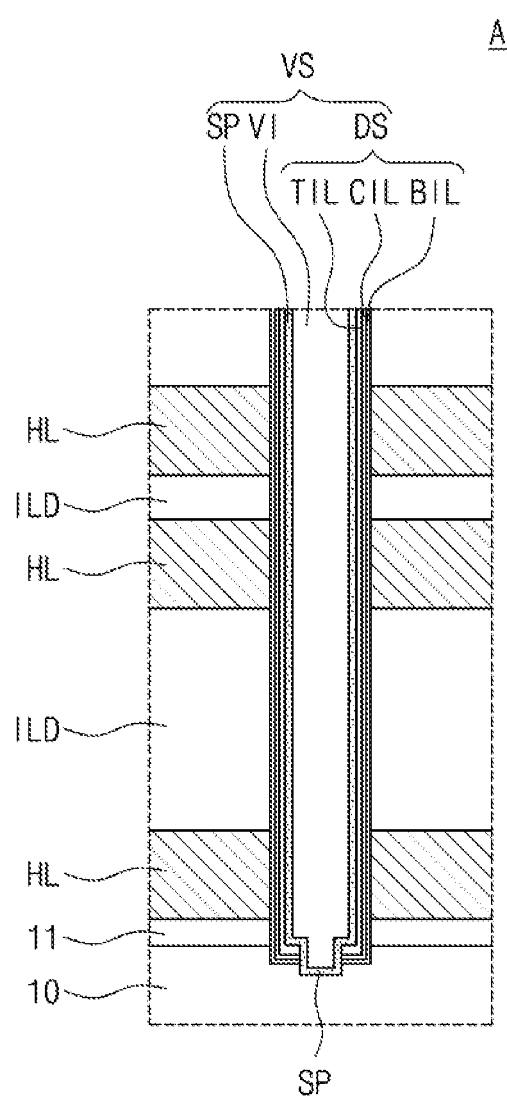
FIGS. 11A and 11B are enlarged views of a portion 'A' of FIG. 6.
Figure 11B:
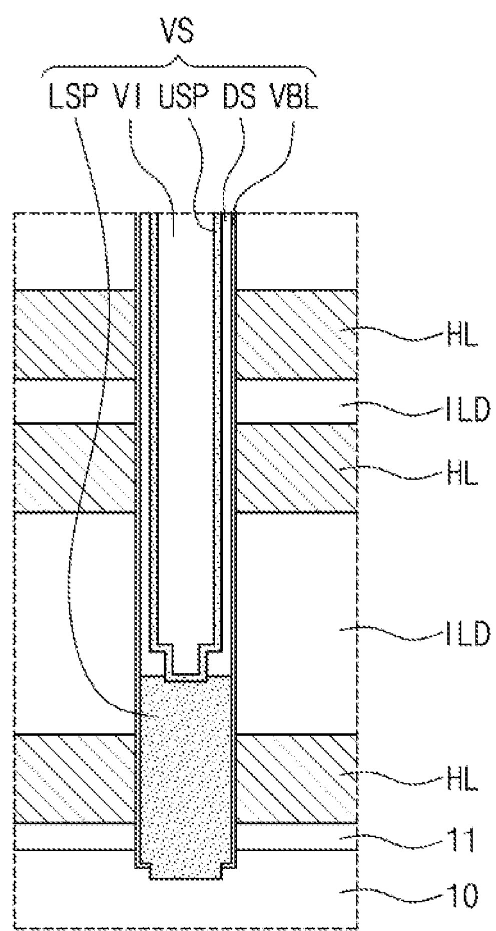

FIG. 4 is a perspective view illustrating a 3D semiconductor memory device according to some embodiments of the inventive concepts. FIG. 5 is a plan view illustrating a 3D semiconductor memory device according to some embodiments of the inventive concepts. FIGS. 6 to 9 are cross-sectional views taken along lines I-I', II-II', III-III' and IV-IV' of FIG. 5, respectively, to illustrate a 3D semiconductor memory device according to some embodiments of the inventive concepts. FIG. 10 is a plan view illustrating a horizontal layer according to some embodiments of the inventive concepts. FIGS. 11A and 11B are enlarged views of a portion 'A' of FIG. 6.

Referring to FIGS. 4, 5, 6, 7, 8 and 9, a substrate 10 may include a cell array region CAR, a block selection region BSR, and a connection region CNR, which are arranged in the first direction D1. The substrate 10 may include a material having a semiconductor property (e.g., a silicon wafer), an insulating material (e.g., a glass substrate), or a semiconductor or conductor covered with an insulating material. For example, the substrate 10 may be a silicon wafer having a first conductivity type.

A stack structure ST may continuously extend from the cell array region CAR onto the connection region CNR in the first direction D1. A buffer insulating layer 11 may be disposed between the stack structure ST and the substrate 10. The stack structure ST may include horizontal layers HL and interlayer insulating layers ILD, which are vertically alternately stacked on the substrate 10.

Each of the horizontal layers HL may include at least one of a semiconductor layer doped with dopants, a silicide layer, or a metal layer. For example, each of the horizontal layers HL may include a poly-crystalline silicon layer doped with dopants of the first conductivity type. Each of the interlayer insulating layers ILD may include a silicon oxide layer and/or a low-k dielectric layer.

In some embodiments, the horizontal layers HL may be semiconductor layers having the first conductivity type and may be doped with dopants of a second conductivity type on the block selection region BSR. In other words, each of the horizontal layers HL may include a channel dopant region CHR having the second conductivity type different from the first conductivity type on the block selection region BSR.

The channel dopant region CHR may electrically isolate each of the memory blocks BLK from the connection region CNR. However, the memory blocks BLK may then be connected to the connection region based on the voltage applied to a block selection gate electrode as described below.

In more detail, referring to FIG. 10, each of the horizontal layers HL may include a plurality of electrode portions EP extending in the first direction D1 and spaced apart from each other in the second direction D2 intersecting the first direction D1 on the cell array region CAR, an electrode connecting portion ICP connecting the electrode portions EP in the second direction D2, and a pad portion PAD horizontally protruding from the electrode connecting portion ICP. The electrode portions EP adjacent to each other may be spaced apart from each other in the second direction D2 by an electrode separation structure provided therebetween.

Each electrode portion EP may correspond to aspects of a memory block BLK of a horizontal layer HL and the electrode connection portion may correspond to aspects of the connection region CNR (i.e., as shown in FIG. 3).

In some embodiments, the electrode portions EP of each of the horizontal layers HL may be located at the same distance (or level) from the substrate 10. The electrode portions EP of each of the horizontal layers HL may be connected to the electrode connecting portion ICP and thus may not be physically isolated from each other. However, the electrode portions EP may be connected to the electrode connecting portion ICP via the channel dopant region CHR. Thus, the electrode portions EP may be selectively connected to the common electrode connecting portion ICP. In the stack structure ST, the horizontal layers HL located at different levels may be electrically isolated from each other.

In some embodiments, each of the electrode portions EP may include a first dopant region SD1 doped with dopants of the first conductivity type on the cell array region CAR, the channel dopant region CHR doped with dopants of the second conductivity type on the block selection region BSR, and a second dopant region SD2 doped with dopants of the first conductivity type on the connection region CNR. A concentration of the dopants may be higher in the first and second dopant regions SD1 and SD2 than in the channel dopant region CHR.

The first dopant region SD1 and the channel dopant region CHR may be joined to each other to form a first PN junction therebetween. The second dopant region SD2 and the channel dopant region CHR may be joined to each other to form a second PN junction therebetween. The first dopant region SD1 and the second dopant region SD2 may be electrically connected to or isolated from each other, depending on a potential of the channel dopant region CHR. In some embodiments, the potential of the channel dopant region CHR may be controlled by a block selection gate electrode VGE. In other words, in each of the horizontal layers HL, the electrode portions EP may be selectively electrically connected to the electrode connecting portion ICP.

Referring again to FIGS. 4 to 9, electrode separation structures ESS (i.e., as shown in FIG. 7) may penetrate the stack structure ST on the cell array region CAR and the block selection region BSR and may extend in the first direction D1. The electrode separation structures ESS may at least partially separate the memory blocks BLK or electrode portions EP. Each of the electrode separation structures ESS may include a common source plug CSP extending in the first direction D1 and an insulating spacer covering a sidewall of the common source plug CSP. The common source plug CSP may be vertical to a top surface of the substrate 10. The common source plug CSP may be connected to a common source region CSR formed in the substrate 10.

The common source regions CSR may be provided in the substrate 10 of the cell array region CAR. The common source regions CSR may be disposed between the electrode portions EP of the horizontal layer HL in a plan view and may extend in the first direction D1. The common source regions CSR may be formed by doping portions of the substrate 10 with dopants of the second conductivity type. For example, the common source regions CSR may include N-type dopants (e.g., arsenic (As) or phosphorus (P)).

In some embodiments, lengths of the electrode separation structures ESS in the first direction D1 may be less than a length of the stack structure ST in the first direction D1. Thus, the electrode separation structures ESS may separate portions of the stack structure ST from each other in the second direction D2. Since the lengths of the electrode separation structures ESS in the first direction D1 may be less than a length of the stack structure ST in the first direction D1, the electrode portions EP between the electrode separation structures ESS may be selectively connected to the common electrode connecting portion ICP via the channel dopant region CHR.

Referring to FIGS. 4, 5, 6 and 7, the three-dimensionally arranged memory cells described with reference to FIG. 1 may be provided on the cell array region CAR. The horizontal layers HtL of the stack structure ST may be used as control lines for controlling the memory cells on the cell array region CAR. The 3D semiconductor memory device according to some embodiments may be the vertical NAND flash memory device, and the horizontal layers HL of the stack structure ST may be used as control gate electrodes of the memory cell transistors and the selection transistors. Alternatively, the 3D semiconductor memory device according to some embodiments may be a variable resistance memory device, and the horizontal layers HL may be word lines connected to first terminals of the memory cells.

A plurality of vertical structures VS vertical to the top surface of the substrate 10 may be disposed on the cell array region CAR. The plurality of vertical structures VS may penetrate the electrode portions EP of the horizontal layers HL and may be spaced apart from the electrode separation structures ESS. The vertical structures VS constituting two rows adjacent to each other may be arranged in a zigzag form along the first direction D1 when viewed in a plan view.

The vertical structures VS may include a semiconductor material such as silicon (Si), germanium (Ge), or a combination thereof. In addition, the vertical structures VS may include a semiconductor material doped with dopants or an intrinsic semiconductor material not doped with dopants. In some embodiments, the vertical structures VS including the semiconductor material may be used as channels of the selection transistors and the memory cell transistors which constitute the cell string of the vertical NAND flash memory device. Alternatively, the vertical structures VS may be formed of a conductive material such as a metal or a semiconductor material doped with dopants. Bit line conductive pads connected to bit line contact plugs BPLG may be disposed on top ends of the vertical structures VS, respectively.

The vertical structures VS according to various embodiments of the inventive concepts will be described later in more detail with reference to FIGS. 11A and 11B.

Figure 8:
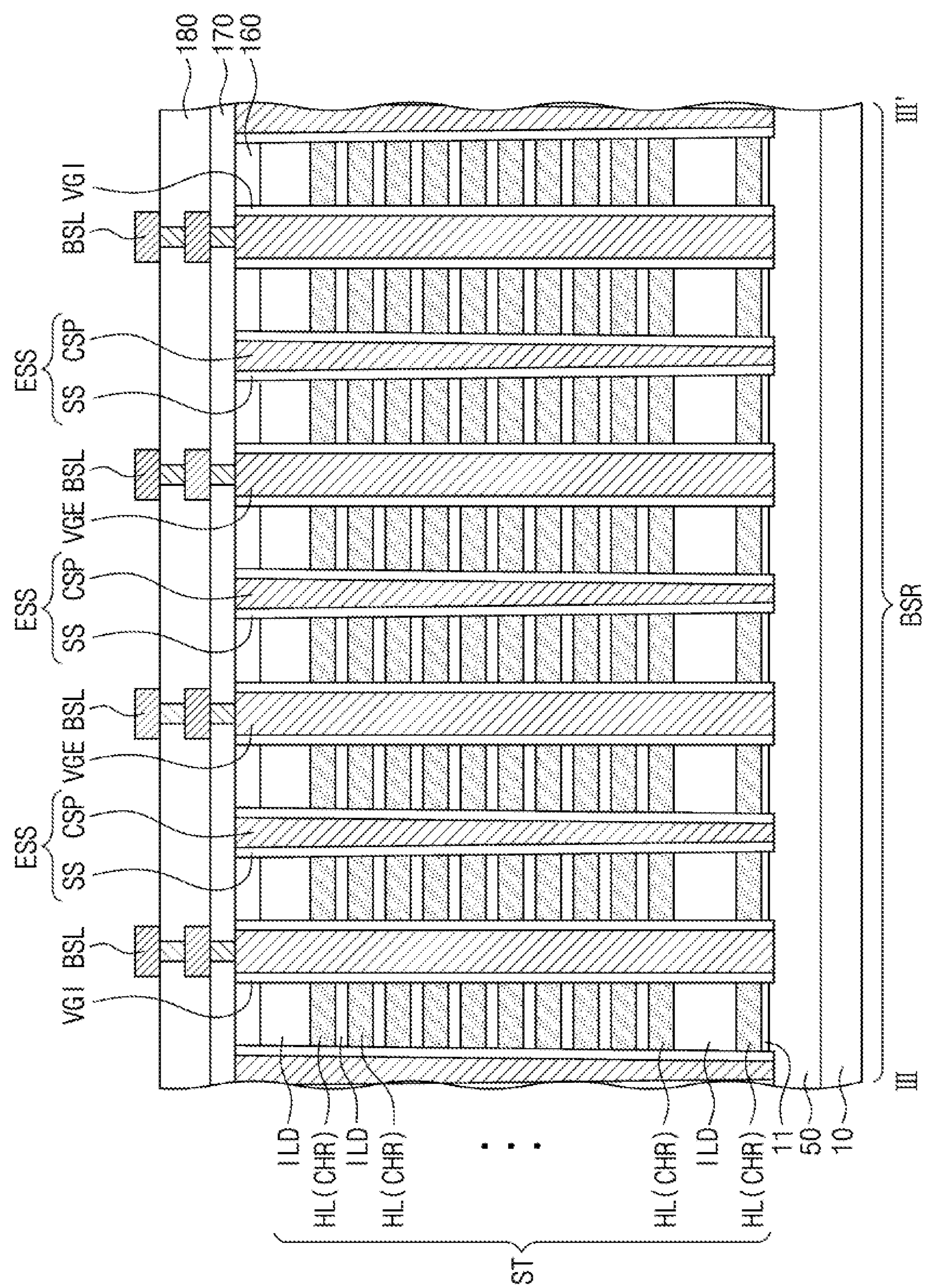

Referring to FIGS. 4, 5 and 8, the block selection circuit described with reference to FIG. 1 may be disposed on the block selection region BSR. The block selection circuit may include block selection transistors using portions of the horizontal layers HL of the stack structure ST as channels. In some embodiments, drain electrodes (i.e., the second dopant region SD2 of the electrode connecting portion ICP) of the block selection transistors located at the same level from the substrate 10 may be electrically connected to each other. The block selection transistors located at different levels from the substrate 10 may be controlled by the block selection gate electrode VGE.

In detail, the block selection gate electrodes VGE vertical to the top surface of the substrate 10 may be disposed on the block selection region BSR. The block selection gate electrodes VGE may be spaced apart from each other in the second direction D2 and may be electrically and physically separated from each other. The block selection gate electrodes VGE may intersect the channel dopant regions CHR of the horizontal layers HL. A width of the block selection gate electrode VGE in the first direction D1 may be greater than a width of the channel dopant region CHR in the first direction D1. The block selection gate electrodes VGE may be in contact with an isolation insulating layer 50 provided in the substrate 10 and may be spaced apart from the substrate 10. The block selection gate electrodes VGE may be connected to block selection lines BSL and may be controlled independently of each other.

The block selection gate electrodes VGE may penetrate the electrode portions EP of the horizontal layers HL on the block selection region BSR. Each of the block selection gate electrodes VGE may be disposed between the electrode separation structures ESS adjacent to each other. Each of the block selection gate electrodes VGE may be located at a substantially equal distance from each of the adjacent electrode separation structures ESS.

A vertical gate insulating layer VGI may be disposed between the stack structure ST and each of the block selection gate electrodes VGE. The vertical gate insulating layer VGI may be vertical to the top surface of the substrate 10 and may surround a sidewall of the block selection gate electrode VGE.

In some embodiments, the block selection gate electrode VGE, the channel dopant region CHR of the electrode portion EP and the first and second dopant regions SD1 and SD2 of the electrode portion EP may constitute the block selection transistor. In other words, portions of the horizontal layer HL at both sides of the channel dopant region CHR may be used as source and drain electrodes of the block selection transistor. In an operation of the 3D semiconductor memory device, the block selection gate electrode VGE may control the potential of the channel dopant region CHR adjacent to both sidewalls of the block selection gate electrode VGE. Thus, the block selection gate electrode VGE may be used to selectively connect the electrode portions EP to the connection region CNR via the channel dopant region CHR.

Figure 9:
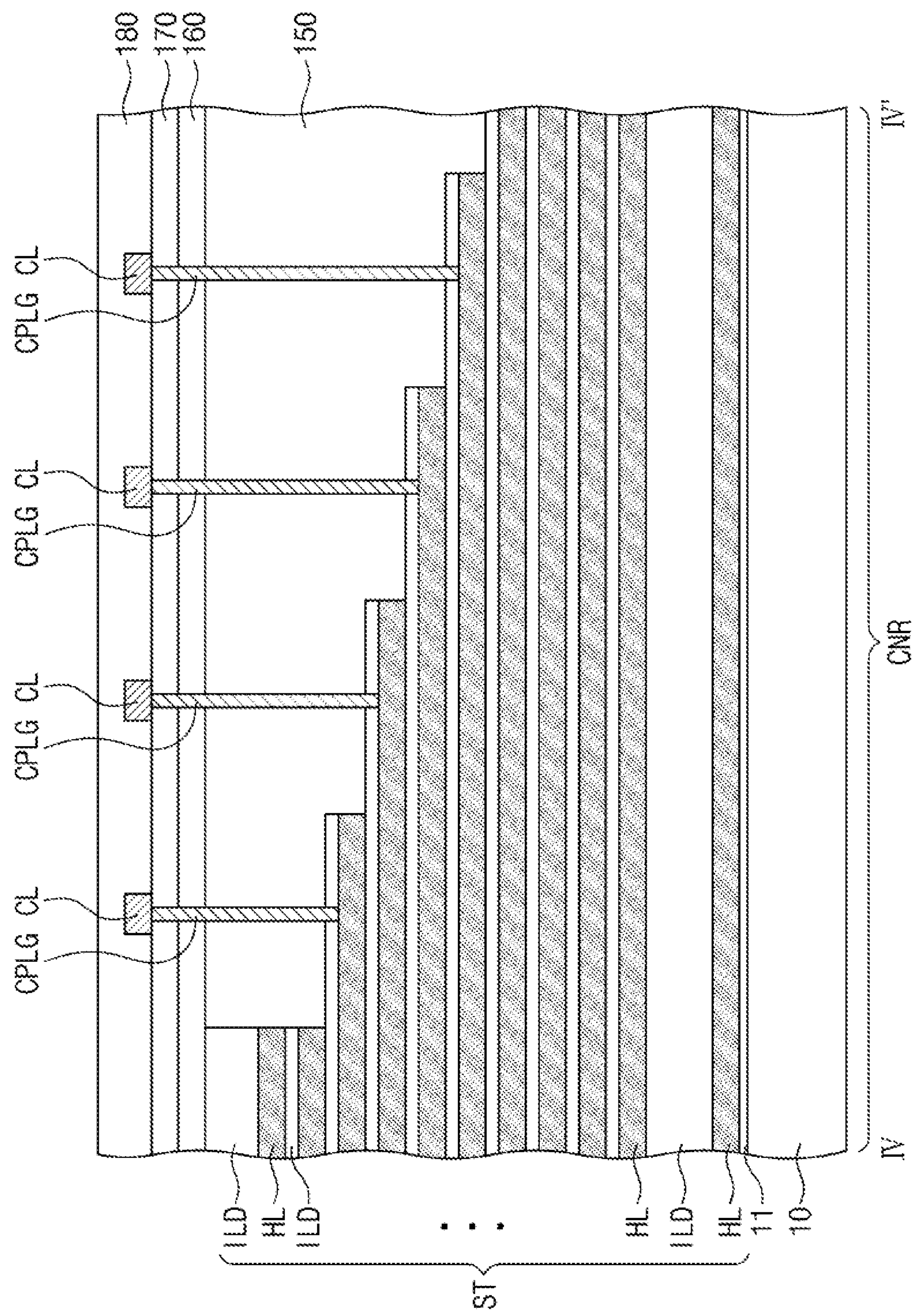

Referring to FIGS. 4, 5 and 9, the stack structure ST may have a stair structure for electrical connection to the row decoder on the connection region CNR. In some embodiments, the stair structure of the stack structure ST may be formed along the second direction D2 intersecting the first direction D1. The stair structure of the stack structure ST may be defined by the pad portions PAD of the horizontal layers HL, which may protrude from the stack structure ST (or from the common electrode connecting portion ICP as illustrated in FIG. 10). The pad portions PAD of the horizontal layers HL may be disposed at positions which are vertically and horizontally different from each other.

An area of the pad portion PAD may be varied depending on a vertical distance from the substrate 10. In some embodiments, widths in the first direction D1 of the pad portions PAD of the horizontal layers HL may be substantially equal to each other, and widths in the second direction D2 of the pad portions PAD of the horizontal layers HL may decrease sequentially as the vertical distance from the substrate 10 increases. That is, the pad portion PAD on the bottom may extend the entire width of the connection region CNR in the second direction D2, but each subsequent pad portion PAD going up in the vertical direction may be somewhat smaller to expose a portion of the pad portions PAD below.

In other words, the pad portions PAD of the horizontal layers HL may form the stair structure along the second direction D2. Maximum lengths of the horizontal layers HL in the first direction D1 may be substantially equal to each other, and the horizontal layers HL may have sidewalls vertically aligned with each other. Because each electrode portion EP on a horizontal layer may be connected to the same pad portion PAD and the pad portions PAD are arranged in the staircase structure, it is possible to prevent a distance in the first direction D1 between the cell array region CAR and the peripheral circuit region from increasing. In other words, it is possible to prevent an area of the connection region CNR from increasing.

Referring to FIGS. 5 to 9, a planarization insulating layer 150 may cover the stack structure ST on the substrate 10. The planarization insulating layer 150 may cover the stair structure of the stack structure ST on the connection region CNR and may have a substantially flat top surface. The planarization insulating layer 150 may include one insulating layer or a plurality of stacked insulating layers. The planarization insulating layer 150 may include, for example, a silicon oxide layer and/or a low-k dielectric layer.

A first interlayer insulating layer 160 may be disposed on the planarization insulating layer 150 and may cover top surfaces of the vertical structures VS. A second interlayer insulating layer 170 may be disposed on the first interlayer insulating layer 160 and may cover top surfaces of the common source plugs CSP.

Bit lines BL extending in the second direction D2 may be disposed on the second interlayer insulating layer 170 of the cell array region CAR. The bit lines BL may be electrically connected to the vertical structures VS through the bit line contact plugs BPLG.

The pad portions PAD of the horizontal layers HL may be connected to an interconnection structure including cell contact plugs CPLG and conductive lines CL.

The cell contact plugs CPLG may penetrate the first and second interlayer insulating layers 160 and 170 and the planarization insulating layer 150 on the connection region CNR so as to be connected to the pad portions PAD of the horizontal layers HL, respectively. The cell contact plugs CPLG may be arranged in the second direction D2, and top surfaces of the cell contact plugs CPLG may be substantially coplanar with each other. Vertical lengths of the cell contact plugs CPLG may be different from each other. The conductive lines CL may be disposed on the second interlayer insulating layer 170 and may be connected to the cell contact plugs CPLG, respectively. A third interlayer insulating layer 180 may be disposed on the second interlayer insulating layer 170 to cover the bit lines BL and the conductive lines CL, and the block selection lines BSL may be disposed on the third interlayer insulating layer 180.

Referring to FIG. 11A, each of the vertical structures VS may include a vertical semiconductor pattern SP and a data storage layer DS. The vertical semiconductor pattern SP may be in direct contact with the substrate 10, and the inside of the vertical semiconductor pattern SP may be filled with a filling insulation pattern VI.

The data storage layer DS may be disposed between the stack structure ST and the vertical semiconductor pattern SP. The data storage layer DS may surround a sidewall of the vertical semiconductor pattern SP on the substrate 10. The data storage layer DS may include a single thin layer or a plurality of thin layers. In some embodiments, the data storage layer DS may be a data storage layer of a NAND flash memory device and may include a tunnel insulating layer TIL, a charge storage layer CIL, and a blocking insulating layer BIL. For example, the charge storage layer CIL may include a trap insulating layer, a floating gate electrode, and/or an insulating layer including conductive nano dots. In more detail, the charge storage layer CIL may include at least one of a silicon nitride layer ($Si_xNi_y$), a silicon oxynitride layer ($SiO_xN_y$), a silicon-rich nitride layer, a nano-crystalline silicon layer, or a laminated trap layer. The tunnel insulating layer TIL may include at least one of materials having energy band gaps greater than that of the charge storage layer CIL, and the blocking insulating layer BIL may include a high-k dielectric layer such as an aluminum oxide layer or a hafnium oxide layer. Alternatively, the data storage layer DS may include a thin layer for a phase-change memory cell or a thin layer for a variable resistance memory cell.

Referring to FIG. 11B, each of the vertical structures VS may include a lower semiconductor pattern LSP, an upper semiconductor pattern USP, a vertical buffer insulating layer VBL, and a data storage layer DS.

For example, the lower semiconductor pattern LSP may be in direct contact with the substrate 10 and may include a pillar-shaped epitaxial pattern extending from the substrate 10. For example, the lower semiconductor pattern LSP may be formed of silicon (Si). Alternatively, the lower semiconductor pattern LSP may include germanium (Ge), silicon-germanium (SiGe), a group III-V semiconductor compound, or a group II-VI semiconductor compound. The lower semiconductor pattern LSP may be an undoped semiconductor pattern, or a semiconductor pattern doped with dopants having the same conductivity type as the substrate 10.

For example, the lower semiconductor pattern LSP may penetrate a lowermost horizontal layer HL of the stack structure ST, and a top surface of the lower semiconductor pattern LSP may be disposed at a higher level than a top surface of the lowermost horizontal layer I-HL of the stack structure ST. Alternatively, the top surface of the lower semiconductor pattern LSP may be disposed at a lower level than a bottom surface of the lowermost horizontal layer HL of the stack structure ST.

The upper semiconductor pattern USP may be in direct contact with the lower semiconductor pattern LSP and may have a pipe shape having a closed bottom end, or a U-shape. The inside of the upper semiconductor pattern USP may be filled with a filling insulation pattern VI including an insulating material.

A bottom surface of the upper semiconductor pattern USP may be disposed at a lower level than the top surface of the lower semiconductor pattern LSP. The upper semiconductor pattern USP may be in an undoped state or may include a semiconductor material doped with dopants having the same conductivity type as the substrate 10. The upper semiconductor pattern USP may have a crystal structure different from that of the lower semiconductor pattern LSP. For example, the upper semiconductor pattern USP may have at least one of a single-crystalline structure, an amorphous structure, or a poly-crystalline structure.

The vertical buffer insulating layer VBL may be disposed between the stack structure ST and the upper semiconductor pattern USP and between the stack structure ST and the lower semiconductor pattern LSP. The vertical buffer insulating layer VBL may extend vertically to the top surface of the substrate 10. The vertical buffer insulating layer VBL may include a high-k dielectric layer such as an aluminum oxide layer and/or a hafnium oxide layer.

The data storage layer DS may be disposed between the vertical buffer insulating layer VBL and the upper semiconductor pattern USP. The data storage layer DS may surround a sidewall of the upper semiconductor pattern USP. The data storage layer DS may have a pipe or macaroni shape of which top and bottom ends are opened. The data storage layer DS may be in contact with a portion of the top surface of the lower semiconductor pattern LSP. A bottom surface of the data storage layer DS may be disposed at a higher level than the bottom surface of the upper semiconductor pattern USP. The data storage layer DS may have substantially the same technical features as the data storage layer DS described with reference to FIG. 11A.

Figure 12A:
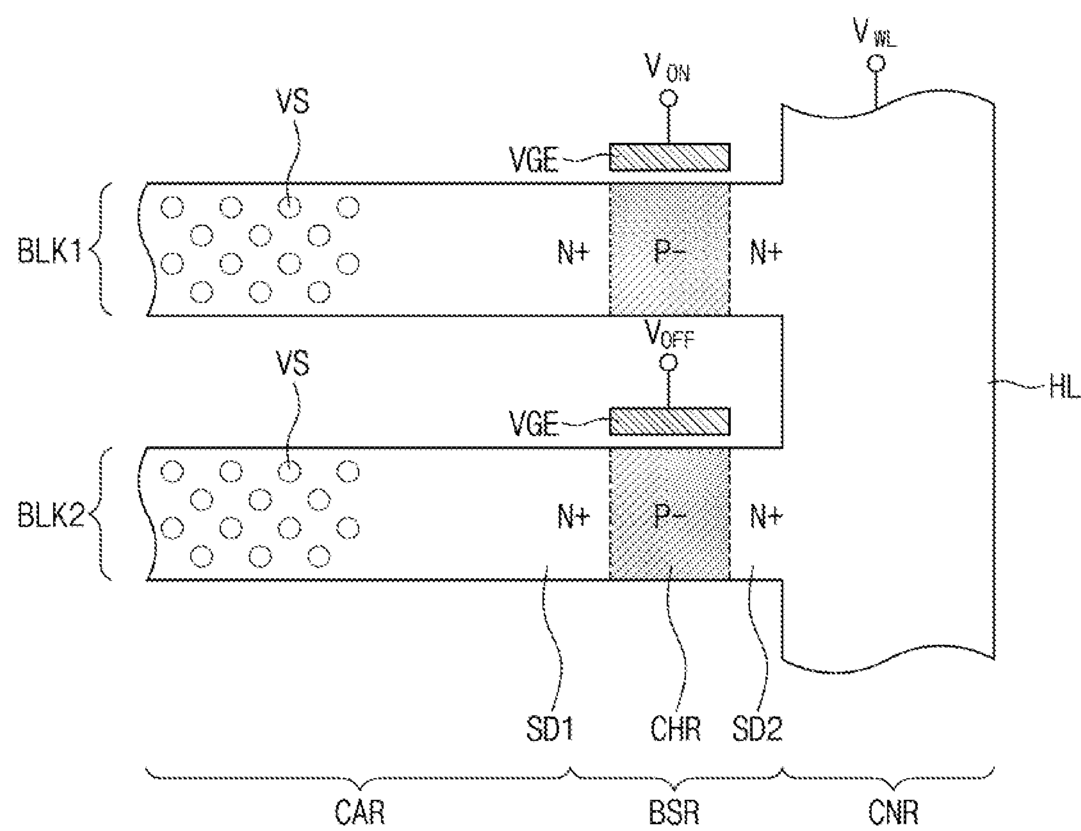
FIGS. 12A and 12B are schematic views illustrating a method of operating a 3D semiconductor memory device according to some embodiments of the inventive concepts.
Figure 12B:
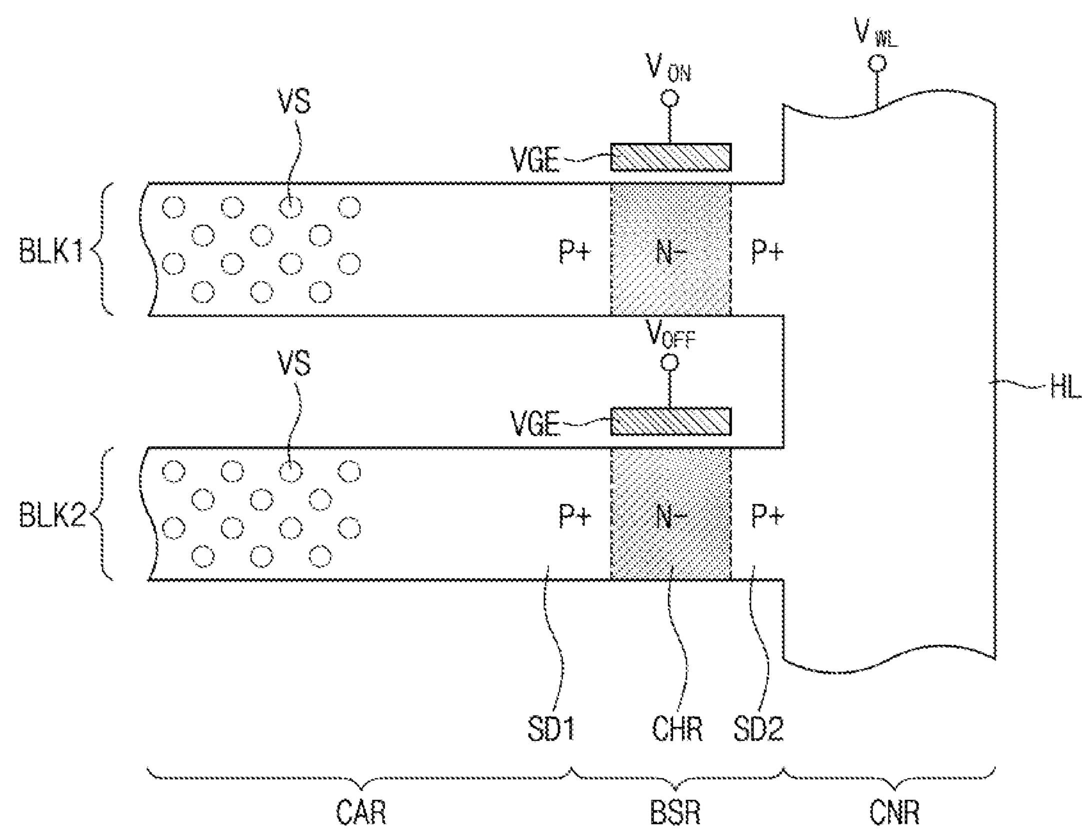

FIGS. 12A and 12B are schematic views illustrating a method of operating a 3D semiconductor memory device according to some embodiments of the inventive concepts.

A 3D semiconductor memory device according to some embodiments may be the 3D semiconductor memory device described with reference to FIGS. 4 to 9, and the descriptions to the same technical features as in the 3D semiconductor memory device described above may be omitted hereinafter for the purpose of ease and convenience in explanation.

Referring to FIG. 12A, in each horizontal layer HL described above with reference to FIG. 10, the channel dopant region CHR may include, for example, P-type dopants, and the first and second dopant regions SD1 and SD2 may include, for example, N-type dopants. By selectively applying a voltage to the block selection gate electrode VGE, the first and second dopant regions SD1 and SD2 may be electrically connected and disconnected as described below.

For example, the 3D semiconductor memory device may include first and second memory blocks BLK1 and BLK2. An embodiment in which the first memory block BLK1 is selected and the second memory block BLK2 is not selected by block selection signals provided to the block selection gate electrodes VGE will be described as an example.

In an operation of the 3D semiconductor memory device, a word line voltage $V_{WL}$ (e.g., a program voltage, a pass voltage, or an erase voltage) may be applied to the horizontal layers HL on the connection region CNR. In other words, a common word line voltage $V_{WL}$ may be applied to the second dopant region SD2 on the connection region CNR. That is, the same voltage may be provided to the drain electrodes of the block selection transistors located at the same level from the substrate. In addition, in the operation of the 3D semiconductor memory device, a voltage (e.g., about 0V) lower than a threshold voltage of the block selection transistor may be applied to the horizontal layers HL on the cell array region CAR.

For example, in a program operation, the program voltage may be applied to a selected horizontal layer HL and the pass voltage may be applied to unselected horizontal layers HL. In an erase operation, the erase voltage may be applied to the horizontal layers HL of the stack structure.

A first gate voltage $V_{ON}$ may be applied to a selected block selection gate electrode VGE. The first gate voltage $V_{ON}$ may be greater than the threshold voltage of the block selection transistor. The word line voltage $V_{WL}$ may be greater than the first gate voltage $V_{ON}$. For example, when the threshold voltage of the block selection transistor is about 2V, the word line voltage $V_{WL}$ may be about 20V and the first gate voltage $V_{ON}$ may be about 2V.

A second gate voltage $V_{OFF}$ may be applied to an unselected block selection gate electrode VGE. The second gate voltage $V_{OFF}$ may be less than the threshold voltage of the block selection transistor. For example, when the threshold voltage of the block selection transistor is about 2V, the second gate voltage $V_{OFF}$ may be about 0V.

Under these conditions, the word line voltage $V_{WL}$ may be transferred to the first dopant region SD1 of the first memory block BLK. In other words, the first dopant region SD1 and the second dopant region SD2 of the first memory block BLK1 may be electrically connected to each other, or the first dopant region SD1 and the second dopant region SD2 of the second memory block BLK2 may be electrically isolated from each other.

Referring to FIG. 12B, in each horizontal layer HL described above with reference to FIG. 10, the channel dopant region CHR may include, for example, N-type dopants, and the first and second dopant regions SD1 and SD2 may include, for example, P-type dopants. By selectively applying a voltage to the block selection gate electrode VGE, the first and second dopant regions SD1 and SD2 may be electrically connected and disconnected as described below.

In an operation of the 3D semiconductor memory device, a first gate voltage $V_{ON}$ may be applied to a selected block selection gate electrode VGE. The first gate voltage $V_{ON}$ may be less than the word line voltage $V_{WL}$. A difference between the first gate voltage $V_{ON}$ and the word line voltage $V_{WL}$ may be greater than the threshold voltage of the block selection transistor. For example, when the threshold voltage of the block selection transistor is about −2V, the word line voltage $V_{WL}$ may be about 20V and the first gate voltage $V_{ON}$ may be about 18V.

A second gate voltage $V_{OFF}$ may be applied to an unselected block selection gate electrode VGE. The second gate voltage $V_{OFF}$ may be greater than the word line voltage $V_{WL}$. A difference between the second gate voltage $V_{OFF}$ and the word line voltage $V_{WL}$ may be less than the threshold voltage of the block selection transistor. For example, when the threshold voltage of the block selection transistor is about −2V, the second gate voltage $V_{OFF}$ may be about 20V.

Figure 13:
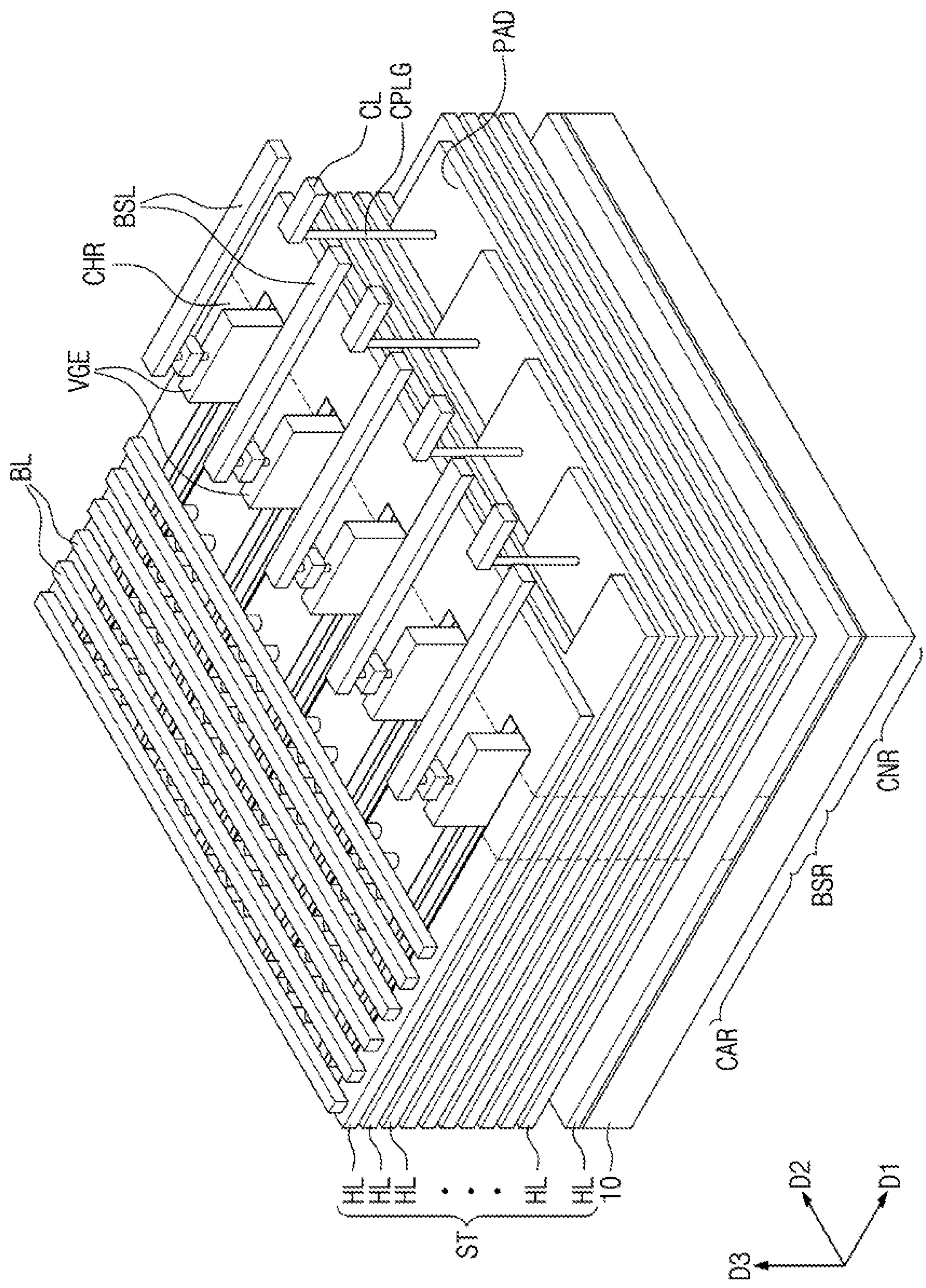
FIG. 13 is a perspective view illustrating a 3D semiconductor memory device according to some embodiments of the inventive concepts.
Figure 14:
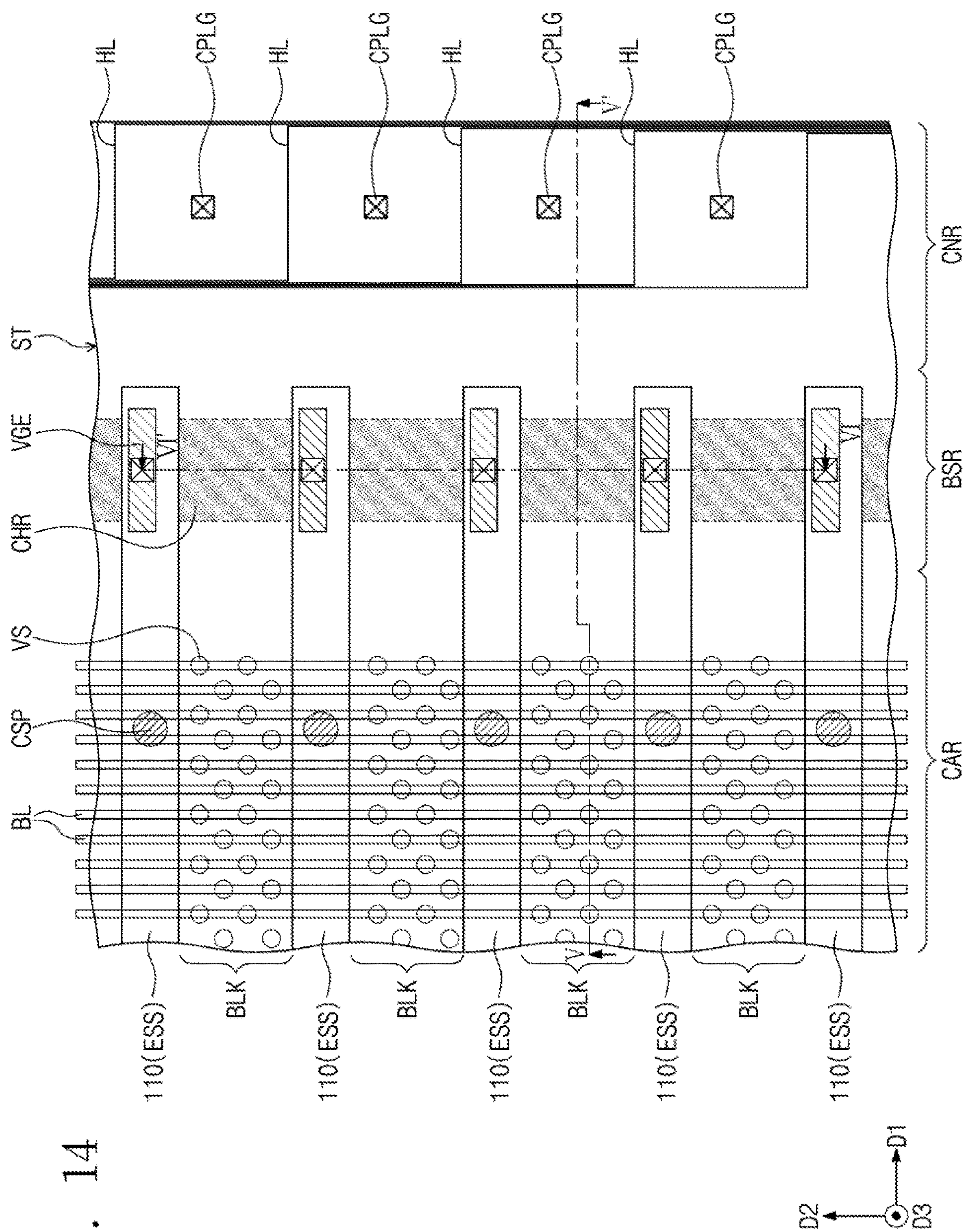
FIG. 14 is a plan view illustrating a 3D semiconductor memory device according to some embodiments of the inventive concepts.

FIG. 13 is a perspective view illustrating a 3D semiconductor memory device according to some embodiments of the inventive concepts. FIG. 14 is a plan view illustrating a 3D semiconductor memory device according to some embodiments of the inventive concepts.

FIG. 13 may include aspects similar to FIG. 4, except that in FIG. 13 the block selection gate electrodes VGE may be aligned within the electrode separation structures ESS.

Figure 15:
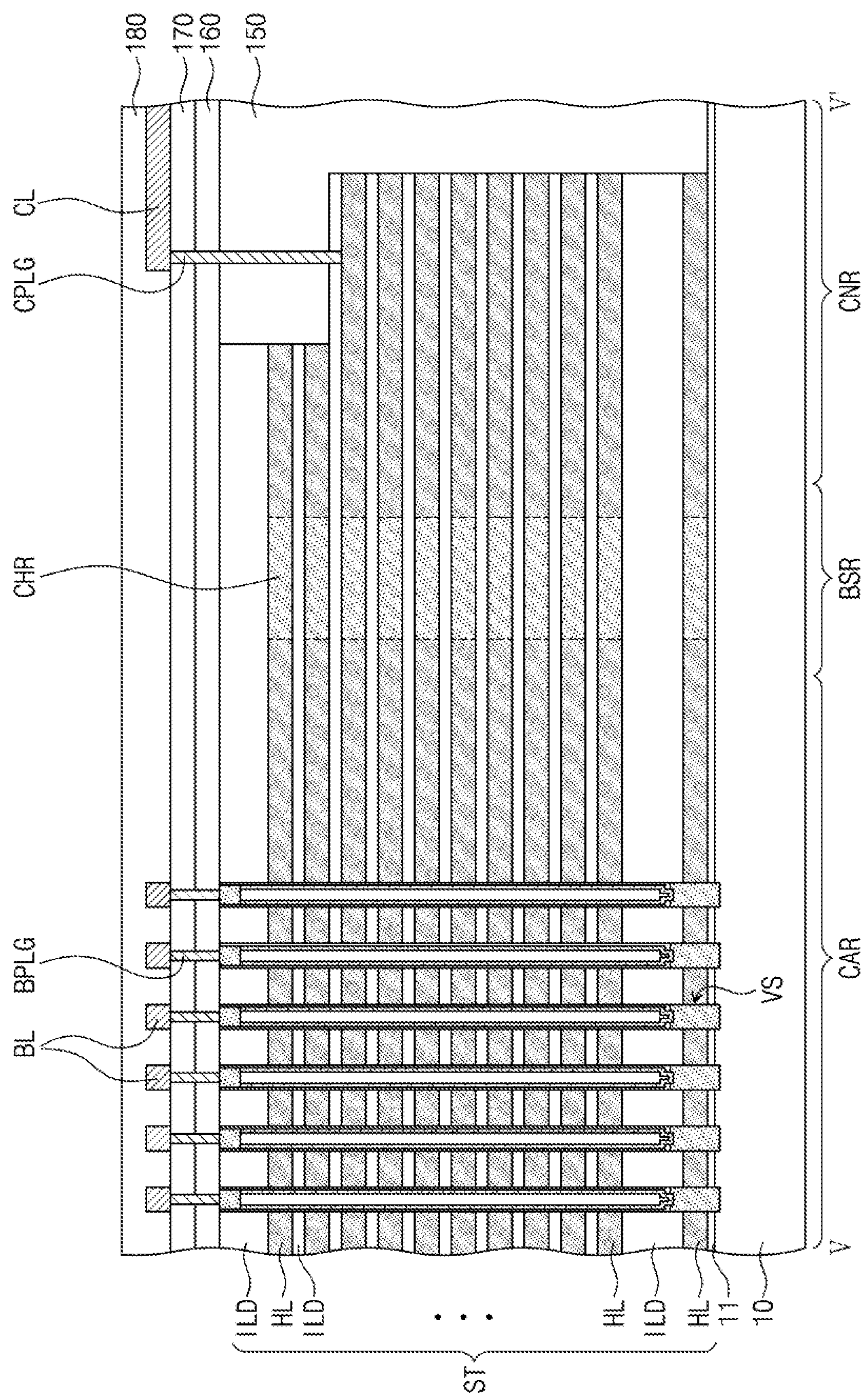
FIGS. 15 and 16 are cross-sectional views taken along lines V-V' and VI-VI[1] of FIG. 14, respectively, to illustrate a 3D semiconductor memory device according to some embodiments of the inventive concepts.
Figure 16:
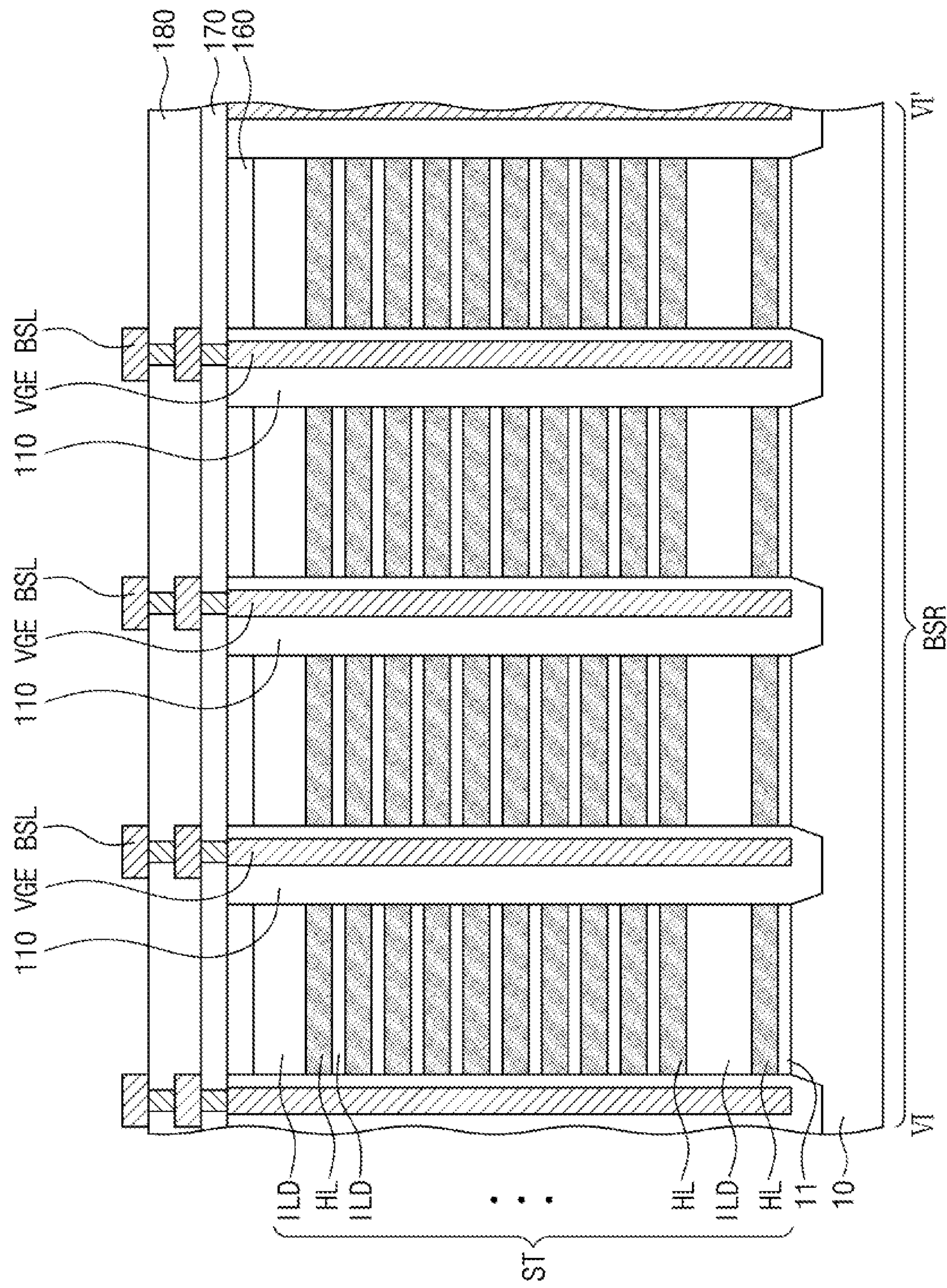

FIGS. 15 and 16 are cross-sectional views taken along lines V-V' and VI-VI' of FIG. 14, respectively, to illustrate a 3D semiconductor memory device according to some embodiments of the inventive concepts.

A 3D semiconductor memory device according to the present embodiments may be the 3D (vertical) semiconductor memory device described with reference to FIG. 3. Hereinafter, the descriptions to the same technical features as in the above embodiments will be omitted for the purpose of ease and convenience in explanation.

Referring to FIGS. 13, 14, 15 and 16, each of electrode separation structures ESS may include a filling insulation layer 110 which is vertical to the top surface of the substrate 10 and extends in the first direction D1. A common source plug CSP may penetrate a portion of the filling insulation layer 110 on the cell array region CAR.

As shown in FIGS. 13-16, in some embodiments the block selection gate electrodes VGE may be disposed between the electrode portions EP of the stack structure ST, respectively. In other words, the block selection gate electrodes VGE may be disposed in the filling insulation layers 110 of the electrode separation structures ESS.

In some embodiments, bottom surfaces of the filling insulation layers 110 may be disposed at a lower level than the top surface of the substrate 10, and portions of the filling insulation layers 110 may be disposed between the substrate 10 and bottom surfaces of the block selection gate electrodes VGE. Thus, the block selection gate electrodes VGE may be spaced apart from the substrate 10.

The block selection gate electrodes VGE may intersect sidewalls of the stack structure ST in the third direction D3 on the block selection region BSR and may be adjacent to the channel dopant regions CHR of the horizontal layers HL.

In more detail, the block selection gate electrode VGE may be disposed between first and second electrode portions EP of each horizontal layer HL, which are adjacent to each other. The block selection gate electrode VGE may be disposed closer to one of the first and second electrode portions EP than the other of the first and second electrode portions EP. In other words, a distance between the first electrode portion EP and the block selection gate electrode VGE may be different from a distance between the second electrode portion EP and the block selection gate electrode VGE.

A predetermined voltage may be applied to the block selection gate electrode VGE to change a potential of the channel dopant region CHR adjacent to a sidewall of the block selection gate electrode VGE.

In the 3D semiconductor memory device according to the embodiments of the inventive concepts, the stack structure may include the horizontal layers vertically stacked on the substrate and having substantially the same length in the first direction and may have the stair structure defined along the second direction for electrical connection between the horizontal layers and the peripheral circuits. Thus, it is possible to prevent a distance in the first direction between the cell array region and the peripheral circuit region from increasing. In other words, it is possible to prevent an area of the connection region from increasing.

In addition, each of the horizontal layers may include the electrode portions separated from each other on the cell array region and the connecting portion connecting the electrode portions on the connection region, and thus the horizontal layers of a plurality of the memory blocks may share a single cell contact plug. Furthermore, the block selection transistors for controlling potentials of the horizontal layers may be disposed on the block selection region between the cell array region and the connection region, and thus the horizontal layers of the memory blocks may be selectively connected to the cell contact plug by the block selection transistor.

The present disclosure uses the terms “cell array region,” “connection region,” and “block selection region” to indicate regions of a semiconductor memory device which may be defined by regions of the plane of an upper surface of the substrate on which the semiconductor memory device is formed. Thus, the regions may be understood to be extended in a vertical direction above the substrate and including, for example, the stacked memory blocks (i.e., layers) above the substrate. Thus, the terms “in” a region and “on” a region may both refer to points directly above the two dimensional area on the substrate that forms the basis for that region. The terms “above” and “vertical” may both refer to the third direction, D3, as indicated in FIGS. 3, 4, 5, 10, 13, and 14.

While the inventive concepts have been described with reference to example embodiments, it will be apparent to those skilled in the art that various changes and modifications may be made without departing from the spirits and scopes of the inventive concepts. Therefore, it should be understood that the above embodiments are not limiting, but illustrative. Thus, the scopes of the inventive concepts are to be determined by the broadest permissible interpretation of the following claims and their equivalents, and shall not be restricted or limited by the foregoing description.

What is claimed is:

1. A three-dimensional (3D) semiconductor memory device comprising:

a substrate including a cell array region, a connection region, and a block selection region between the cell array region and the connection region;

a stack structure including horizontal layers vertically stacked on the substrate, each of the horizontal layers including: a plurality of electrode portions extending in a first direction on the cell array region and the block selection region; and a connecting portion disposed on the connection region to connect the electrode portions in a second direction perpendicular to the first direction; and block selection gate electrodes intersecting sidewalk of the electrode portions of the horizontal layers on the block selection region, wherein each of the electrode portions includes a first semiconductor region having a first conductivity type on the cell array region and on the connection region and a channel dopant region having a second conductivity type different from the first conductivity type on the block selection region.

2. The 3D semiconductor memory device of claim 1, wherein a concentration of dopants of the first conductivity type in the first semiconductor region is higher than a concentration of dopants of the second conductivity type in the channel dopant region.

3. The 3D semiconductor memory device of claim 1, wherein each of the horizontal layers further comprises: a pad portion horizontally protruding from the connecting portion, and wherein the pad portions of the horizontal layers are arranged along the second direction when viewed in a plan view.

4. The 3D semiconductor memory device of claim 3, wherein each of the pad portions includes a second semiconductor region having the first conductivity type, the 3D semiconductor memory device further comprising:

contact plugs connected to the pad portions, respectively.

5. The 3D semiconductor memory device of claim 1, wherein the horizontal layers have substantially the same maximum length in the first direction.

6. The 3D semiconductor memory device of claim 1, further comprising:

vertical structures penetrating the stack structure on the cell array region, wherein each of the vertical structures comprises: a vertical semiconductor pattern vertical to a top surface of the substrate; and a data storage layer between the vertical semiconductor pattern and the stack structure.

7. The 3D semiconductor memory device of claim 6, further comprising:

bit lines which extend in the second direction to intersect the electrode portions of the horizontal layers and are connected to the vertical structures.

8. The 3D semiconductor memory device of claim 1, wherein the block selection gate electrodes are spaced apart from each other in the second direction and penetrate the electrode portions of each of the horizontal layers, respectively.

9. The 3D semiconductor memory device of claim 8, further comprising:

a vertical gate insulating layer surrounding a sidewall of each of the block selection gate electrodes.

10. The 3D semiconductor memory device of claim 1, wherein each of the block selection gate electrodes is disposed between the electrode portions adjacent to each other when viewed in a plan view.

11. The 3D semiconductor memory device of claim 10, further comprising:

a vertical gate insulating layer disposed between a sidewall of the stack structure and each of the block selection gate electrodes.

12. A three-dimensional (3D) semiconductor memory device comprising:

a substrate including a cell array region, a connection region, and a block selection region between the cell array region and the connection region;

a stack structure comprising semiconductor layers of a first conductivity type and interlayer insulating layers, which are vertically alternately stacked on the substrate;

vertical structures penetrating the stack structure on the cell array region; and a block selection gate electrode intersecting a sidewall of the stack structure on the block selection region, wherein each of the semiconductor layers includes a channel dopant region which is adjacent to the block selection gate electrode on the block selection region and has a second conductivity type different from the first conductivity type.

13. The 3D semiconductor memory device of claim 12, wherein a concentration of dopants of the first conductivity type on the cell array region and the connection region is higher than a concentration of dopants of the second conductivity type on the block selection region.

14. The 3D semiconductor memory device of claim 12, further comprising:

electrode separation structures penetrating the stack structure on the cell array region and the block selection region and extending in a first direction, wherein the vertical structures are spaced apart from the electrode separation structures and penetrate the stack structure.

15. The 3D semiconductor memory device of claim 14, wherein each of the semiconductor layers includes: a plurality of electrode portions spaced apart from each other by the electrode separation structures; a connecting portion horizontally, connecting the electrode portions on the connection region; and a pad portion horizontally protruding from the connecting portion, and wherein the pad portions of the semiconductor layers are arranged along a second direction perpendicular to the first direction when viewed in a plan view.

16. The 3D semiconductor memory device of claim 15, wherein the electrode portions include first and second electrode portions adjacent to each other, wherein the block selection gate electrode is disposed between the first and second electrode portions, and wherein a distance between the first electrode portion and the block selection gate electrode is different from a distance between the second electrode portion and the block selection gate electrode.

17. The 3D semiconductor memory device of claim 14, wherein the block selection gate electrode is spaced apart from the electrode separation structures and penetrates the stack structure.

18. The 3D semiconductor memory device of claim 14, wherein each of the electrode separation structures includes a filling insulation layer, and wherein the block selection gate electrode penetrates the filling insulation layer.

19. The 3D semiconductor memory device of claim 12, wherein the vertical structures include a semiconductor material, and the block selection gate electrode includes a conductive material.

20. A three-dimensional (3D) semiconductor memory device comprising:

a substrate; and a stack structure including a plurality of horizontal layers stacked on the substrate, each of the horizontal layers including:

a plurality of electrode portions at least partially separated in a first horizontal direction, wherein each of the plurality of electrode portions includes a first conductivity type and a second conductivity type different from the first conductivity type;

a connecting portion connecting the electrode portions in the first horizontal direction; and a pad portion protruding from the connecting portion in a second horizontal direction perpendicular to the first horizontal direction; a plurality of block selection gate electrodes respectively intersecting the plurality of electrode portions of each of the horizontal layers, wherein each of the block selection gate electrodes selectively connects one of the plurality of electrode portions to the connecting portion, wherein the pad portions of the horizontal layers are arranged in a staircase structure extending in the second horizontal direction.

* * * * *